US012696605B2

(12) United States Patent
Kim

(10) Patent No.: US 12,696,605 B2
(45) Date of Patent: Jul. 28, 2026

(54) DISPLAY DEVICE AND MANUFACTURING METHOD THEREFOR

(71) Applicant: SAMSUNG DISPLAY CO., LTD., Yongin-si (KR)

(72) Inventor: Duk Sung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 701 days.

(21) Appl. No.: 18/014,952

(22) PCT Filed: Jun. 17, 2021

(86) PCT No.: PCT/KR2021/007623
§ 371 (c)(1),
(2) Date: Jan. 6, 2023

(87) PCT Pub. No.: WO2022/010126
PCT Pub. Date: Jan. 13, 2022

(65) Prior Publication Data
US 2023/0299120 A1 Sep. 21, 2023

(30) Foreign Application Priority Data
Jul. 9, 2020 (KR) ........................ 10-2020-0084890

(51) Int. Cl.
*H10H 29/14* (2025.01)
*H10H 20/01* (2025.01)
(Continued)

(52) U.S. Cl.
CPC .......... *H10H 29/142* (2025.01); *H10H 20/01* (2025.01); *H10H 20/821* (2025.01);
(Continued)

(58) Field of Classification Search
CPC ........... H10H 29/30–49; H10H 29/857; H10H 20/857; H01L 25/0753; H01L 33/62; H10W 90/00
See application file for complete search history.

(56) References Cited

U.S. PATENT DOCUMENTS 10,769,990 B2  9/2020  Cho et al.
11,037,914 B2  6/2021  Kim
(Continued)

FOREIGN PATENT DOCUMENTS

CN  110098222 A  8/2019
CN  110277421  9/2019
(Continued)

OTHER PUBLICATIONS

International Search Report for PCT/KR2021/007623 dated Sep. 24, 2021.
(Continued)

*Primary Examiner* — Lauren R Bell
(74) *Attorney, Agent, or Firm* — Womble Bond Dickinson (US) LLP

(57) ABSTRACT

A display device may include a substrate including pixel areas each having first and second areas, and pixels disposed in the pixel areas. The pixels may include a pixel circuit part which is disposed in the first area and including a bottom metal layer disposed on the substrate and at least one transistor disposed on the bottom metal layer. A display element part may be disposed at the second area and include a first electrode and a second electrode that are spaced apart from each other, and light emitting diodes disposed between the first and second electrodes to emit light. The first and second electrodes and the bottom metal layer may be disposed on a same layer.

18 Claims, 24 Drawing Sheets

(51) Int. Cl.
  *H10H 20/821*   (2025.01)
  *H10H 20/84*    (2025.01)
  *H10H 20/851*   (2025.01)
  *H10H 20/855*   (2025.01)

(52) U.S. Cl.
  CPC .......... *H10H 20/84* (2025.01); *H10H 20/851*
   (2025.01); *H10H 20/855* (2025.01); *H10H*
   *20/0361* (2025.01); *H10H 20/0363* (2025.01)

(56)     References Cited

U.S. PATENT DOCUMENTS

| | | | | |
|---|---|---|---|---|
| 11,049,916 | B2 | 6/2021 | Lee et al. | |
| 11,251,223 | B2 | 2/2022 | Long | |
| 11,984,434 | B2 | 5/2024 | Kim et al. | |
| 12,027,508 | B2 | 7/2024 | Yoo et al. | |
| 2020/0403131 | A1* | 12/2020 | Kim | H10H 20/819 |
| 2021/0391309 | A1* | 12/2021 | Kim | H10W 90/00 |
| 2022/0020812 | A1* | 1/2022 | Kwon | H10H 29/142 |
| 2022/0052031 | A1 | 2/2022 | Kang et al. | |
| 2022/0059739 | A1 | 2/2022 | Li et al. | |
| 2022/0115364 | A1* | 4/2022 | Jeon | H10D 86/441 |
| 2022/0115470 | A1 | 4/2022 | Kim et al. | |
| 2022/0130896 | A1* | 4/2022 | Kim | H10H 20/855 |
| 2022/0165787 | A1* | 5/2022 | Lee | H10H 20/857 |
| 2022/0173160 | A1* | 6/2022 | Pak | H10H 29/142 |
| 2023/0268330 | A1* | 8/2023 | Kim | H10W 90/00 |
| | | | | 257/79 |

FOREIGN PATENT DOCUMENTS

| | | | |
|---|---|---|---|
| CN | 115812252 A | 3/2023 | |
| KR | 10-2017-0080251 A | 7/2017 | |
| KR | 10-2018-0045964 | 5/2018 | |
| KR | 10-2019-0098305 | 8/2019 | |
| KR | 10-2020-0005692 | 1/2020 | |
| KR | 10-2020-0034896 | 4/2020 | |
| KR | 10-2020-0042057 A | 4/2020 | |
| KR | 10-2020-0063399 | 6/2020 | |
| KR | 10-2020-0077671 | 7/2020 | |
| KR | 10-2021-0055829 | 5/2021 | |
| WO | 2020/059989 A1 | 3/2020 | |
| WO | WO-2020075933 A1 * | 4/2020 | H10W 90/00 |

OTHER PUBLICATIONS

Written Opinion of the International Searching Authority for PCT/KR2021/007623 dated Sep. 24, 2021.

* cited by examiner

INS4

CF
INS3

CCL
QD

INS2
INS1
ILD2
SUB

II          II'
CNE1   EL1   ILD2   LD   INS1   EL2   CNE2

EMA

FIG. 10L

CL1 {
  BML
  EL1, EL2
  CNL6
}

CL3 {
  BRL, FOL1
  PD1_1, Dj
  UE, PL1, PL2
}

CL4 {
  PD1_2
  CNE1
  CNE2
}

DISPLAY DEVICE AND MANUFACTURING METHOD THEREFOR

CROSS-REFERENCE TO RELATED APPLICATION(S)

This application is a national entry of International Application No. PCT/KR2021/007623, filed on Jun. 17, 2021, which claims under 35 U.S.C. § 119(a) and 365(b) priority to and benefits of Korean Patent Application No. 10-2020-0084890, filed on Jul. 9, 2020 in the Korean Intellectual Property Office, the entire contents of which are incorporated herein by reference.

BACKGROUND

Technical Field

The disclosure relates to a display device and a method of manufacturing the same.

Description of Related Art

As interest in information displays and demand for portable information media increase, research and commercialization on display devices are actively being conducted.

SUMMARY

An embodiment of the disclosure provides a display device manufactured through a simple manufacturing process by minimizing a misalignment of light-emitting elements to improve light output efficiency and also reducing the number of masks, and a method of manufacturing the same.

A display device according to an embodiment may include a substrate including pixel areas which each have a first area and a second area, and a pixel disposed in each of the pixel areas. A pixel may include a pixel circuit part which is disposed in the first area and includes a bottom metal layer disposed on the substrate, and at least one transistor disposed on the bottom metal layer. A display element part may be disposed in the second area and includes a first electrode and a second electrode that are spaced apart from each other, and a plurality o light-emitting elements disposed between the first electrode and the second electrode to emit light.

The first and second electrodes and the bottom metal layer may be disposed on a same layer.

In an embodiment, each of the pixel circuit part and the display element part may be disposed as a multi-layer including one or more conductive layers and one or more insulating layers. At least one layer of the pixel circuit part and at least one layer of the display element part may be disposed on a same layer.

In an embodiment, the insulating layers included in each of the pixel circuit part and the display element part may include a first insulating layer, a second insulating layer, a third insulating layer, and a fourth insulating layer that are sequentially disposed on the substrate. The conductive layers included in the pixel circuit part may include a first conductive layer disposed between the substrate and the first insulating layer, a second conductive layer disposed on the first insulating layer, a third conductive layer disposed on the second insulating layer, and a fourth conductive layer disposed on the fourth insulating layer. The conductive layers included in the display element part may include a first conductive layer disposed between the substrate and the first insulating layer and a fourth conductive layer disposed on the fourth insulating layer.

The first conductive layer may include the bottom metal layer, the first electrode, and the second electrode.

In an embodiment, the second area may include an emission area from which the light is emitted. The third insulating layer of the display element part may be disposed on the first and second electrodes in the emission area to expose a portion of each of the first and second electrodes. The fourth insulating layer of the display element part may be provided only on one surface of each of the light-emitting elements in the emission area.

In an embodiment, the fourth insulating layer disposed on the one surface of each of the light-emitting elements may expose both end portions of each of the light-emitting elements.

In an embodiment, the display element part may further include a first contact electrode disposed on the fourth insulating layer to electrically connect the first electrode and each of the light-emitting elements, and a second contact electrode disposed on the fourth insulating layer to electrically connect the second electrode and each of the light-emitting elements. The fourth conductive layer may include the first and second contact electrodes.

In an embodiment, the substrate may include a display area in which the pixel areas are disposed and a non-display area that surrounds at least one side of the display area. A line part electrically connected to the pixel circuit part and a pad part connected to the line part may be disposed in the non-display area. The pad part may include a first pad electrode disposed on the second insulating layer, and a second pad electrode disposed on the first pad electrode and in contact with the first pad electrode.

In an embodiment, the second pad electrode may be disposed on the fourth insulating layer. The fourth conductive layer may include the second pad electrode. Here, the first and second contact electrodes and the second pad electrode may be disposed on the same layer.

In an embodiment, the display device may further include a protective layer disposed between the third insulating layer and the fourth insulating layer. The protective layer may be disposed in each of the non-display area, the first area, and a remaining area of the second area except for the emission area.

In an embodiment, the display device may further include a light blocking layer disposed on the protective layer. The light blocking layer may include a black matrix.

In an embodiment, the display device may further include a light conversion pattern layer disposed in the emission area of the second area and disposed on the first and second contact electrodes. The display device may further include a fifth insulating layer disposed on the light conversion pattern layer.

In an embodiment, the transistor may include an active pattern disposed on a buffer layer on the bottom metal layer, a gate electrode disposed on the first insulating layer and overlapping the active pattern, and a first terminal and a second terminal that are in electrical contact with both ends of the active pattern. Here, the second conductive layer may include the gate electrode.

The above-described display device may be manufactured through a method of manufacturing a display device, the method including providing a pixel, which includes at least one pixel area having a first area and a second area, on a substrate.

In an embodiment, the providing of the pixel may include forming a first conductive layer on the substrate, forming a buffer layer on the first conductive layer and forming a semiconductor layer on the buffer layer in the first area, forming a first insulating layer on the buffer layer including the semiconductor layer and forming a second conductive layer on the first insulating layer, forming a second insulating layer, which includes an opening configured to expose the first conductive layer of the second area, on the first insulating layer including the second conductive layer, forming a third conductive layer on the second insulating layer, applying an insulating material layer on each of the second insulating layer including the third conductive layer and the exposed first conductive layer and forming a protective layer on a remaining region except for a region of the insulating material layer corresponding to the exposed first conductive layer, aligning light-emitting elements on the insulating material layer on the exposed first conductive layer, forming a fourth insulating layer on the protective layer and the light-emitting elements and etching the insulating material layer to form a third insulating layer that exposes a portion of the first conductive layer of the second area, and forming a fourth conductive layer on the fourth insulating layer.

According to embodiments, a pixel circuit part and a display element part may be disposed on one surface of the same substrate, thereby providing a slim display device having a decreased thickness and a method of manufacturing the same.

According to embodiments, components included in a pixel circuit part and components included in a display element part may be formed through the same process, thereby simplifying a manufacturing process of a display device.

Effects of embodiments are not limited to the above-described effects, and more diverse effects are included in the specification.

BRIEF DESCRIPTION OF THE DRAWINGS

Figure 10L:
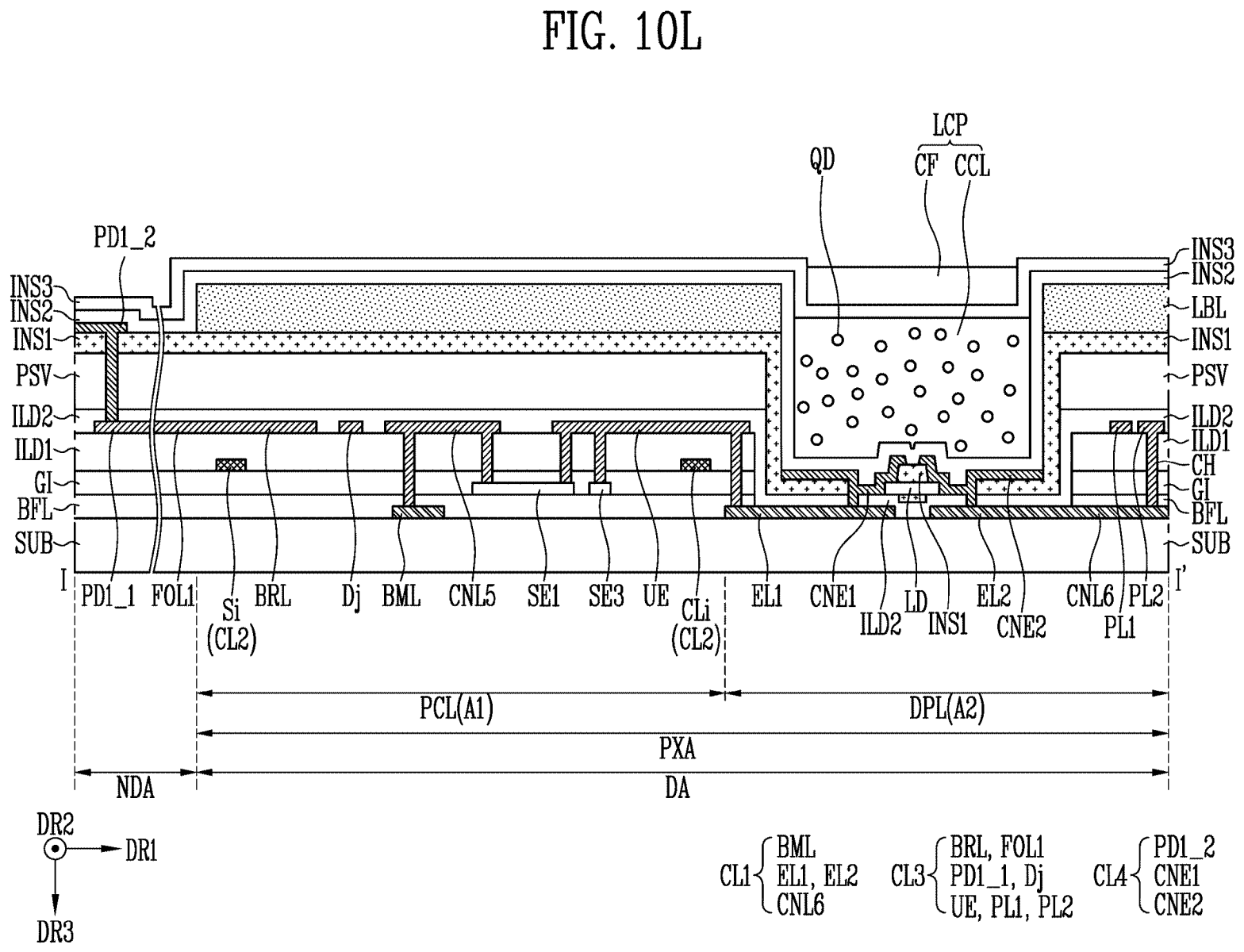

FIGS. 10A to 10M are schematic cross-sectional views sequentially illustrating a method of manufacturing the display device shown in FIG. 8.

DETAILED DESCRIPTION OF THE EMBODIMENTS

Figure 1:
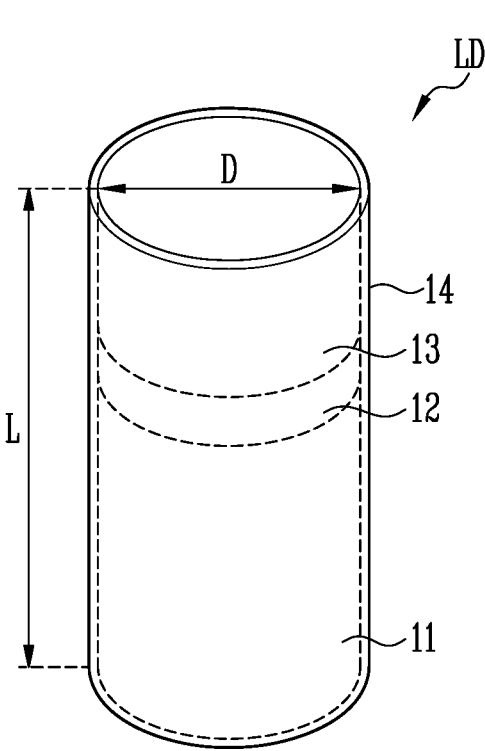
FIG. 1 is a schematic perspective view illustrating a light-emitting element according to an embodiment.

While the disclosure is open to various modifications and alternative embodiments, specific embodiments thereof will be described and illustrated by way of example in the accompanying drawings. However, this is not purported to limit the disclosure to a specific disclosed form, but it shall be understood to include all modifications, equivalents and substitutes within the idea and the technological scope of the disclosure.

Like numbers refer to like elements throughout the description of the drawings. In the accompanying drawings, the dimensions of structures may be exaggerated to clarify the described technology. While terms such as "first," "second," and the like may be used to describe various components, such components must not be understood as being limited to the above terms. These terms are only used for the purpose of distinguishing one element from another element. For example, without departing from the scope of the disclosure, a first component may be referred to as a second component, and likewise a second component may be referred to as a first component. A singular expression includes a plural expression unless the context clearly indicates otherwise. As used herein, the singular forms, "a," "an," and "the" are intended to include the plural forms as well, unless the context clearly indicates otherwise. In the specification and the claims, the phrase "at least one of" is intended to include the meaning of "at least one selected from the group of" for the purpose of its meaning and interpretation. For example, "at least one of A and B" may be understood to mean "A, B, or A and B."

In this application, it should be understood that terms such as "comprise" or "include" or "have" are intended to indicate that there is a feature, number, step, operation, component, part, or a combination thereof, and they do not exclude in advance the possibility of the presence or addition of one or more other features, numbers, steps, operations, components, parts or combinations thereof. Also, when a portion such as a layer, a film, an area, a plate, or the like is referred to as being "on" another portion, this includes not only the case where the portion is "directly on" the another portion but also the case where still another portion is interposed therebetween. Further, in the specification, when a portion such as a layer, a film, an area, a plate, or the like is formed on another portion, a direction, in which the portion is formed, is not limited only to an upper direction, and includes a lateral direction or a lower direction. When a portion such as a layer, a film, an area, a plate, or the like is referred to as being "under" another portion, this includes not only the case where the portion is "directly under" the another portion but also the case where still another portion is interposed therebetween.

It should be understood that if an element (for example, a first element) is referred to as being (operatively or communicatively) "connected," or "coupled," to another element (for example, a second element), the element may be directly connected or directly coupled to the other element or any other element (for example, a third element) may be interposed there between. It may be understood that if an element (for example, a first element) is referred to as being "directly connected," or "directly coupled" to another element (for example, a second element), there may be no element (for example, a third element) interposed therebetween. In the specification and the claims, the term "and/or" is intended to include any combination of the terms "and" and "or" for the purpose of its meaning and interpretation.

For example, "A and/or B" may be understood to mean "A, B, or A and B." The terms "and" and "or" may be used in the conjunctive or disjunctive sense and may be understood to be equivalent to "and/or."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
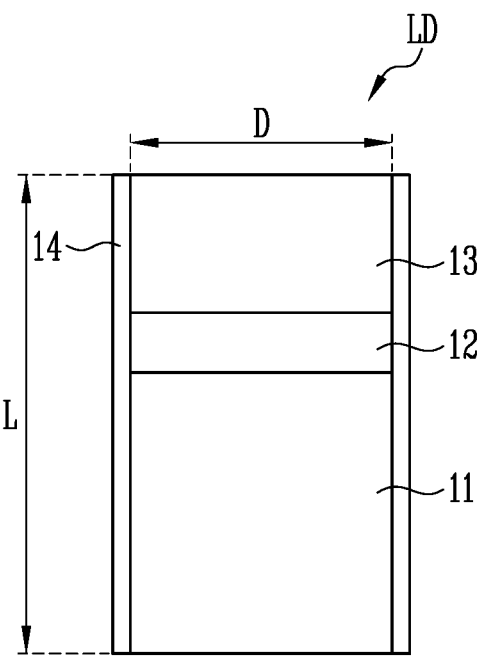
FIG. 2 is a schematic cross-sectional view of the light-emitting element of FIG. 1.
Figure 3:
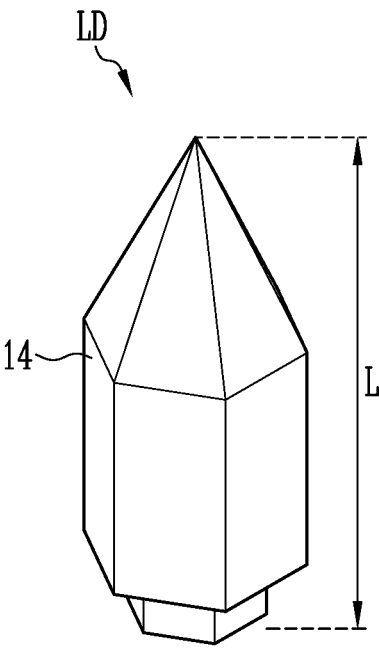
FIG. 3 is a schematic perspective view illustrating a light-emitting element according to another embodiment.
Figure 4:
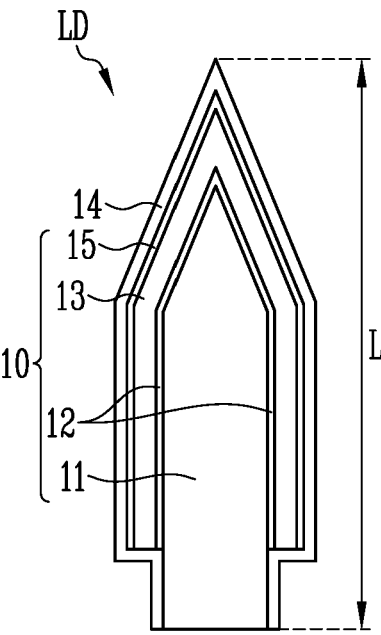
FIG. 4 is a schematic cross-sectional view of the light-emitting element of FIG. 3.

FIG. 1 is a schematic perspective view illustrating a light-emitting element LD according to an embodiment. FIG. 2 is a schematic cross-sectional view of the light-emitting element LD of FIG. 1. FIG. 3 is a schematic perspective view illustrating a light-emitting element LD according to another embodiment. FIG. 4 is a schematic cross-sectional view of the light-emitting element LD of FIG. 3.

In an embodiment, a type and/or shape of the light-emitting element LD is not limited to the embodiments shown in FIGS. 1 to 4.

Referring to FIGS. 1 to 4, the light-emitting element LD may include a first semiconductor layer 11, a second semiconductor layer 13, and an active layer 12 interposed between the first semiconductor layer 11 and the second semiconductor layer 13. As an example, the light-emitting element LD may implement a light-emitting stack in which the first semiconductor layer 11, the active layer 12, and the second semiconductor layer 13 are sequentially stacked on each other.

The light-emitting element LD may be provided (disposed) in a shape extending in a direction. When it is assumed that an extending direction of the light-emitting element LD is a length direction thereof, the light-emitting element LD may include one end portion (or a lower end portion) and the other end portion (or an upper end portion) in the extending direction. Any one semiconductor layer of the first and second semiconductor layers 11 and 13 may be disposed at any one end portion (or the lower end portion) of the light-emitting element LD, and the other semiconductor layer of the first and second semiconductor layers 11 and 13 may be disposed at the other end portion (or the upper end portion) of the light-emitting element LD. As an example, the first semiconductor layer 11 may be disposed at one end portion (or the lower end portion) of the light-emitting element LD, and the second semiconductor layer 13 may be disposed at the other end portion (or the upper end portion) of the light-emitting element LD.

The light-emitting element LD may be provided in various shapes. As an example, the light-emitting element LD may have a long rod-like shape or a bar-like shape that is long in a length direction thereof (that is, has an aspect ratio that is greater than 1). In an embodiment, the length L of the light-emitting element LD in the length direction may be greater than the diameter D or the width of the cross section. The light-emitting element LD may include, for example, a light-emitting diode (LED) manufactured in an ultra-small size to have a diameter D and/or a length L ranging from nanoscale to microscale.

The diameter D of the light-emitting element LD may be in a range of about 0.5 μm to about 500 μm, and the length L thereof may be in a range of about 1 μm to about 1,000 μm. However, the diameter D and the length L of the light-emitting element LD are not limited thereto, and the size of the light-emitting element LD may be changed to meet requirements (or design conditions) of a lighting device or a self-luminous display device to which the light-emitting element LD is applied.

The first semiconductor layer 11 may include, for example, at least one n-type semiconductor layer. For example, the first semiconductor layer 11 may include at least one semiconductor material selected from among InAlGaN, GaN, AlGaN, InGaN, AlN, and InN and may be an n-type semiconductor layer doped with a first conductive dopant (or an n-type dopant) such as Si, Ge, and/or Sn. However, a material constituting the first semiconductor layer 11 is not limited thereto, and the first semiconductor layer 11 may be made of various materials. The first semiconductor layer 11 may include a gallium nitride (GaN) semiconductor material doped with the first conductive dopant (or the n-type dopant). The first semiconductor layer 11 may include an upper surface in contact with the active layer 12 and a lower surface exposed to the outside in a direction of the length L of the light-emitting element LD. The lower surface of the first semiconductor layer 11 may correspond to one end portion (or the lower end portion) of the light-emitting element LD.

The active layer 12 may be disposed on the first semiconductor layer 11 and may be formed in a single or multi-quantum well structure. As an example, in case that the active layer 12 is formed in the multi-quantum well structure, in the active layer 12, a barrier layer (not shown), a strain reinforcing layer, and a well layer may be periodically and repeatedly stacked as one unit. The strain reinforcing layer may have a smaller lattice constant than the barrier layer to further reinforce strain applied to the well layer, for example, compressive strain. However, the structure of the active layer 12 is not limited to the above-described embodiment.

The active layer 12 may emit light having a wavelength of 400 nm to 900 nm, and a double heterostructure may be used. In an embodiment, a clad layer (not shown) doped with a conductive dopant may be formed on upper and/or lower portions of the active layer 12 in the direction of the length L of the light-emitting element LD. As an example, the cladding layer may be formed as an AlGaN layer or an InAlGaN layer. According to an embodiment, a material such as AlGaN or InAlGaN may be used to form the active layer 12, and, various materials may constitute the active layer 12. The active layer 12 may include a first surface in contact with the first semiconductor layer 11 and a second surface in contact with the second semiconductor layer 13.

In case that an electric field having a certain voltage or more is applied to both ends of the light-emitting element LD, electron-hole pairs may be generated in the active layer 12 so that the light-emitting element LD emits light. By controlling light emission of the light-emitting element LD using such a principle, the light-emitting element LD can be used as a pixel of a display device as well as a light source (light-emitting source) of various light-emitting devices.

The second semiconductor layer 13 may be disposed on the second surface of the active layer 12 and may include a semiconductor layer of a different type from the first semiconductor layer 11. As an example, the second semiconductor layer 13 may include, for example, at least one p-type semiconductor layer. For example, the second semiconductor layer 13 may include at least one semiconductor material selected from among InAlGaN, GaN, AlGaN, InGaN, AlN, and InN and may be an p-type semiconductor layer doped with a second conductive dopant (or a p-type dopant) such as Mg. However, a material constituting the second semiconductor layer 13 is not limited thereto, and the second semiconductor layer 13 may be made of various materials. In an embodiment, the second semiconductor layer 13 may include a gallium nitride (GaN) semiconductor material doped with the second conductive dopant (or the p-type dopant). The second semiconductor layer 13 may include a lower surface in contact with the second surface of the active layer 12 and an upper surface exposed to the outside in the direction of the length L of the light-emitting element LD. Here, the upper surface of the second semiconductor layer 13 may correspond to the other end portion (or the upper end portion) of the light-emitting element LD.

In an embodiment, the first semiconductor layer 11 and the second semiconductor layer 13 may have different thicknesses in the direction of the length L of the light-emitting element LD. As an example, the first semiconductor layer 11 may relatively thicker than the second semiconductor layer 13 in the direction of the length L of the light-emitting element LD. Accordingly, the active layer 12 of the light-emitting element LD may be positioned closer to the upper surface of the second semiconductor layer 13 than to the lower surface of the first semiconductor layer 11.

Although the first semiconductor layer 11 and the second semiconductor layer 13 are each illustrated as being formed as one layer, the disclosure is not limited thereto. In an embodiment, according to a material of the active layer 12, each of the first semiconductor layer 11 and the second semiconductor layer 13 may further include one or more layers, for example, a cladding layer and/or a tensile strain barrier reducing (TSBR) layer. The TSBR layer may be a strain mitigating layer disposed between semiconductor layers having different lattice structures to serve as a buffer for reducing a lattice constant difference. The TSBR layer may be formed as a p-type semiconductor layer including p-GaInP, p-AlInP, or p-AlGaInP, but the disclosure is not limited thereto.

According to an embodiment, in addition to the first semiconductor layer 11, the active layer 12, and the second semiconductor layer 13 described above, the light-emitting element LD may further include an additional electrode (15, hereinafter, referred to as "first additional electrode"). According to another embodiment, the light-emitting element LD may further include another additional electrode (not shown, hereinafter, referred to as "second additional electrode") disposed at an end of the first semiconductor layer 11.

Each of the first and second additional electrodes may be an ohmic contact electrode, but the disclosure is not limited thereto. According to an embodiment, the first and second additional electrodes may be Schottky contact electrodes. The first and second additional electrodes may include a conductive material (or substance). For example, the first and second additional electrodes may include an opaque metal in which chromium (Cr), titanium (Ti), aluminum (Al), gold (Au), nickel (Ni), and/or an oxide or alloy thereof are used alone or in combination, but the disclosure is not limited thereto. According to an embodiment, the first and second additional electrodes may include a transparent conductive oxide such as indium tin oxide (ITO), indium zinc oxide (IZO), zinc oxide (ZnO), indium gallium zinc oxide (IGZO), and/or indium tin zinc oxide (ITZO).

Materials included in the first and second additional electrodes may be the same as or different. The first and second additional electrodes may be substantially transparent or translucent. Accordingly, light generated by the light-emitting element LD may pass through each of the first and second additional electrodes to be emitted to the outside of the light-emitting element LD. According to an embodiment, in case that light generated by the light-emitting element LD is emitted to the outside of the light-emitting element LD through a region excluding both end portions of the light-emitting element LD without passing through the first and second additional electrodes, the first and second additional electrodes may include an opaque metal.

In an embodiment, the light-emitting element LD may further include an insulating film 14. However, in some embodiments, the insulating film 14 may be omitted or provided to cover only some of the first semiconductor layer 11, the active layer 12, and the second semiconductor layer 13.

The insulating film 14 may prevent an electrical short circuit that may occur in case that the active layer 12 comes into contact with a conductive material other than the first and second semiconductor layers 11 and 13. The insulating film 14 may minimize surface defects of the light-emitting element LD, thereby improving a lifetime and luminous efficiency of the light-emitting element LD. In case that multiple light-emitting elements LD are closely arranged, the insulating film 14 may prevent an undesired short circuit between the light-emitting elements LD. In case that a short circuit between the active layer 12 and an external conductive material can be prevented, whether the insulating film 14 is provided is not limited.

The insulating film 14 may be provided in a form which surrounds the entirety of an outer circumferential surface of the light-emitting stack including the first semiconductor layer 11, the active layer 12, and the second semiconductor layer 13.

In an above-described embodiment, the insulating film 14 has been described in the form which surrounds the entirety of an outer circumferential surface of each of the first semiconductor layer 11, the active layer 12, and the second semiconductor layer 13, but the disclosure is not limited thereto. According to an embodiment, in case that the light-emitting element LD includes the first additional electrode, the insulating film 14 may surround the entirety of an outer circumferential surface of each of the first semiconductor layer 11, the active layer 12, the second semiconductor layer 13, and the first additional electrode. According to another embodiment, the insulating film 14 may not surround the entirety of the outer circumferential surface of the first additional electrode or surround only a portion of the outer circumferential surface of the first additional electrode and may not surround the rest of the outer circumferential surface of the first additional electrode. Furthermore, according to still another embodiment, in case that the first additional electrode is disposed at the other end portion (or the upper end portion) of the light-emitting element LD, and the second additional electrode is disposed at one end portion (or the lower end portion) of the light-emitting element LD, the insulating film 14 may expose at least one region of each of the first and second additional electrodes.

The insulating film 14 may include a transparent insulating material. For example, the insulating film 14 may include at least one insulating material selected from the group consisting of silicon oxide (SiO$_x$), silicon nitride ($SiN_x$), silicon oxynitride ($SiO_xN_y$), aluminum oxide ($AlO_x$), and titanium oxide ($TiO_2$), but the disclosure is not limited thereto. Various materials having an insulating property may be used as a material of the insulating film 14.

According to an embodiment, the light-emitting element LD may include a light-emitting pattern 10 having a core-shell structure as shown in FIGS. 3 and 4. The first semiconductor layer 11 may be positioned in a core of the light-emitting element LD, for example, in a middle (or a center) thereof, the active layer 12 may be provided and/or formed in a form surrounding the outer circumferential surface of the first semiconductor layer 11 in the direction of the length L of the light-emitting element LD, and the second semiconductor layer 13 may be provided and/or formed in a form surrounding the active layer 12 in the direction of the length L of the light-emitting element LD. The light-emitting element LD may further include an additional electrode (not shown) surrounding at least one side of the second semiconductor layer 13. Furthermore, according to an embodiment, the light-emitting element LD may further include an insulating film 14 which is provided on an outer circumferential surface of the light-emitting pattern 10 having the core-shell structure and includes a transparent insulating material. The light-emitting element LD including the light-emitting pattern 10 having the core-shell structure may be manufactured through a growth method.

The above-described light-emitting element LD may be used as a light-emitting source of various display devices. The light-emitting element LD may be manufactured through a surface treatment process. For example, in case that the light-emitting elements LD are mixed with a flow-able solution (or solvent) and supplied to each pixel area (for example, an emission area of each pixel or an emission area of each subpixel), each of the light-emitting elements LD may be surface-treated such that the light-emitting elements LD may be uniformly sprayed without agglomeration in the solution.

An emission unit (or an emission device) including the above-described light-emitting element LD may be used in a display device as well as various types of electronic devices requiring a light source. For example, in case that multiple light-emitting elements LD are disposed in a pixel area of each pixel of a display panel, the light-emitting elements LD may be used as light sources of each pixel. However, an application field of the light-emitting element LD is not limited to the above-described example. For example, the light-emitting element LD may also be used in other types of electronic devices requiring a light source, such as a lighting device.

Figure 5:
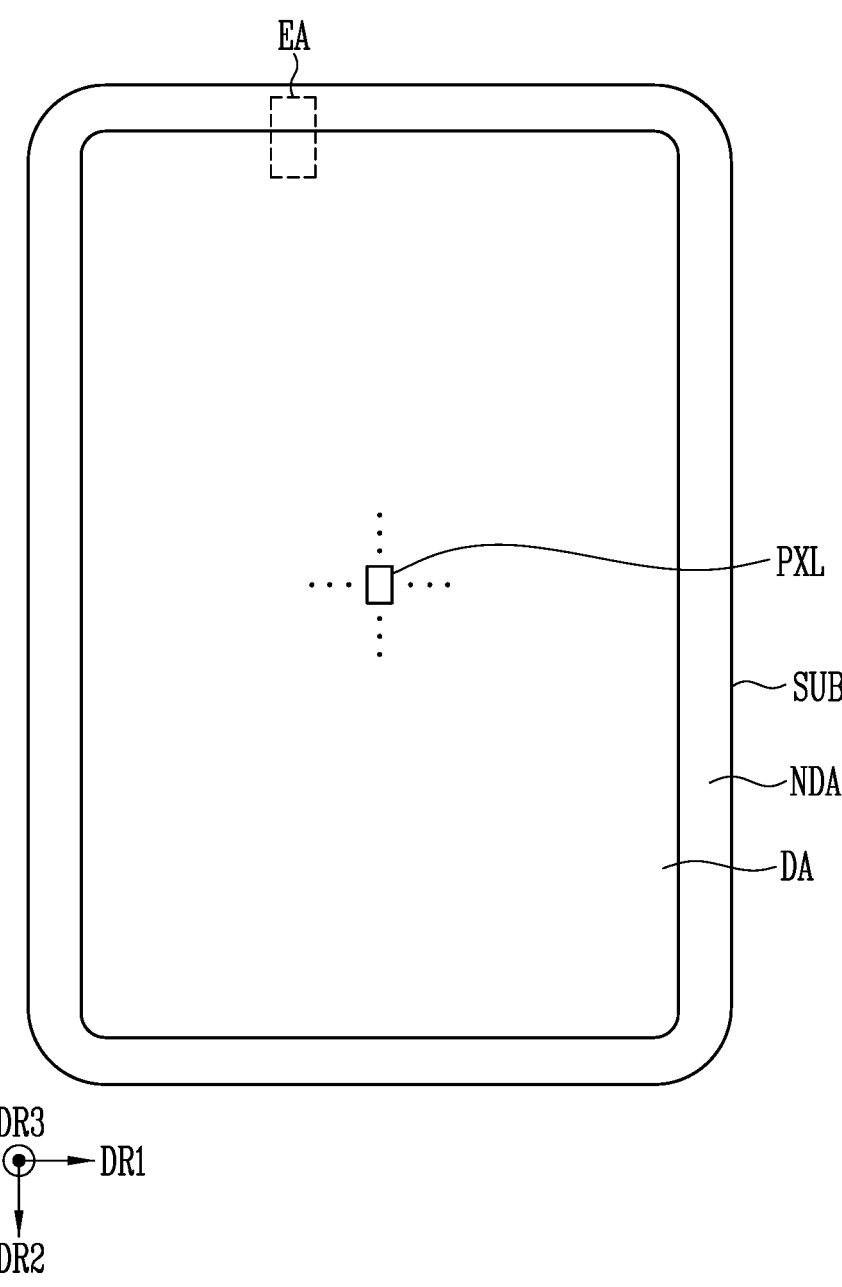
FIG. 5 is a schematic view illustrating a display device according to an embodiment, and in particular, a schematic plan view of a display device using any one light-emitting element of the light-emitting elements shown in FIGS. 1 to 4 as a light source.

FIG. 5 is a schematic view illustrating a display device according to an embodiment, and in particular, a schematic plan view of a display device using at least one light-emitting element of the light-emitting elements LD shown in FIGS. 1 to 4 as a light source.

In FIG. 5, for convenience, a structure of the display device is schematically illustrated centering on a display area DA in which an image is displayed.

Referring to FIGS. 1 to 5, the display device according to an embodiment may include a substrate SUB, pixels PXL which are provided on the substrate SUB and each includes one or more light-emitting elements LD, a driver which is provided on the substrate SUB and drives the pixels PXL, and a line part which connects the pixels PXL and the driver.

In case that a display device is an electronic device, in which a display surface is applied to at least one surface thereof, such as a smartphone, a television, a tablet personal computer (PC), a mobile phone, an image phone, an e-book reader, a desktop PC, a laptop PC, a netbook computer, a workstation, a server, a personal digital assistant (PDA), a portable multimedia player (PMP), an MP3 player, a medical device, a camera, or a wearable device, the disclosure may be applied.

Display devices may be classified into a passive matrix type display device and an active matrix type display device according to a driving method of the light-emitting element LD. For example, in case that the display device is implemented as an active matrix type, each of the pixels PXL may include a driving transistor which controls an amount of current supplied to the light-emitting element LD, a switching transistor which transmits a data signal to the driving transistor, and the like.

The display device may be provided in various shapes and, for example, may be provided in a rectangular plate shape having two pairs of sides parallel to each other, but the invention is not limited thereto. In case that the display device is provided in the rectangular plate shape, one pair of sides of the two pairs of sides may be provided longer than the other pair of sides. For convenience, a case in which the display device has a rectangular shape having a pair of long sides and a pair of short sides is shown. An extending direction of the long side is indicated as a second direction DR2, and an extending direction of the short side is indicated as a first direction DR1. In the display device provided in the rectangular plate shape, a corner at which one long side and one short side are in contact with each other (or meet) may have a round shape.

The substrate SUB may include a display area DA and a non-display area NDA.

The display area DA may be an area in which the pixels PXL for displaying an image are provided. The non-display area NDA may be an area in which the driver for driving the pixels PXL and a portion of the line part for connecting the pixels PXL and the driver are provided. For convenience, only one pixel PXL is illustrated in FIG. 5, but multiple pixels PXL may be substantially provided in the display area DA of the substrate SUB.

The non-display area NDA may be provided on at least one side of the display area DA. The non-display area NDA may surround a circumference (or an edge) of the display area DA. In the non-display area NDA, the line part connected to the pixels PXL and the driver connected to the line part to drive the pixels PXL may be provided.

The line part may electrically connect the driver and the pixels PXL. The line part may provide a signal to each pixel PXL and may be a fan-out line connected to signal lines connected to each pixel PXL, for example, a scan line, a data line, an emission control line, and the like. The line part may be a fan-out line connected to signal lines connected to each pixel PXL, for example, a control line, a sensing line, and the like in order to compensate for a change in electrical characteristics of each pixel PXL in real time.

The substrate SUB may include a transparent insulating material to transmit light. The substrate SUB may be a rigid substrate or a flexible substrate.

An area of the substrate SUB may be provided as the display area DA so that the pixels PXL are disposed therein, and the remaining area of the substrate SUB may be provided as the non-display area NDA. For example, the substrate SUB may include the display area DA including pixel areas in which each pixel PXL is disposed and the non-display area NDA disposed around the display area DA (or adjacent to the display area DA).

Each of the pixels PXL may be provided in the display area DA of the substrate SUB. In an embodiment, the pixels PXL may be arranged in a stripe arrangement structure or the like in the display area DA, but the disclosure is not limited thereto.

Each pixel PXL may include one or more light-emitting elements LD driven by a corresponding scan signal and data signal. The light-emitting element LD may have a small size ranging from nanoscale to microscale and may be connected in parallel with adjacent light-emitting elements, but the disclosure is not limited thereto. The light-emitting element LD may constitute a light source of each pixel PXL.

Each pixel PXL may include at least one light source driven by a certain signal (for example, a scan signal and a data signal) and/or certain power (for example, first driving power and second driving power), for example the light-emitting element LD shown in FIGS. 1 to 4. However, in an embodiment, a type of the light-emitting element LD usable as the light source of each pixel PXL is not limited thereto.

The driver may provide a certain signal and certain power to each pixel PXL through the line part and thus may control the driving of the pixel PXL. The driver may include a scan driver, an emission driver, a data driver, a timing controller, and the like.

Figure 6A:
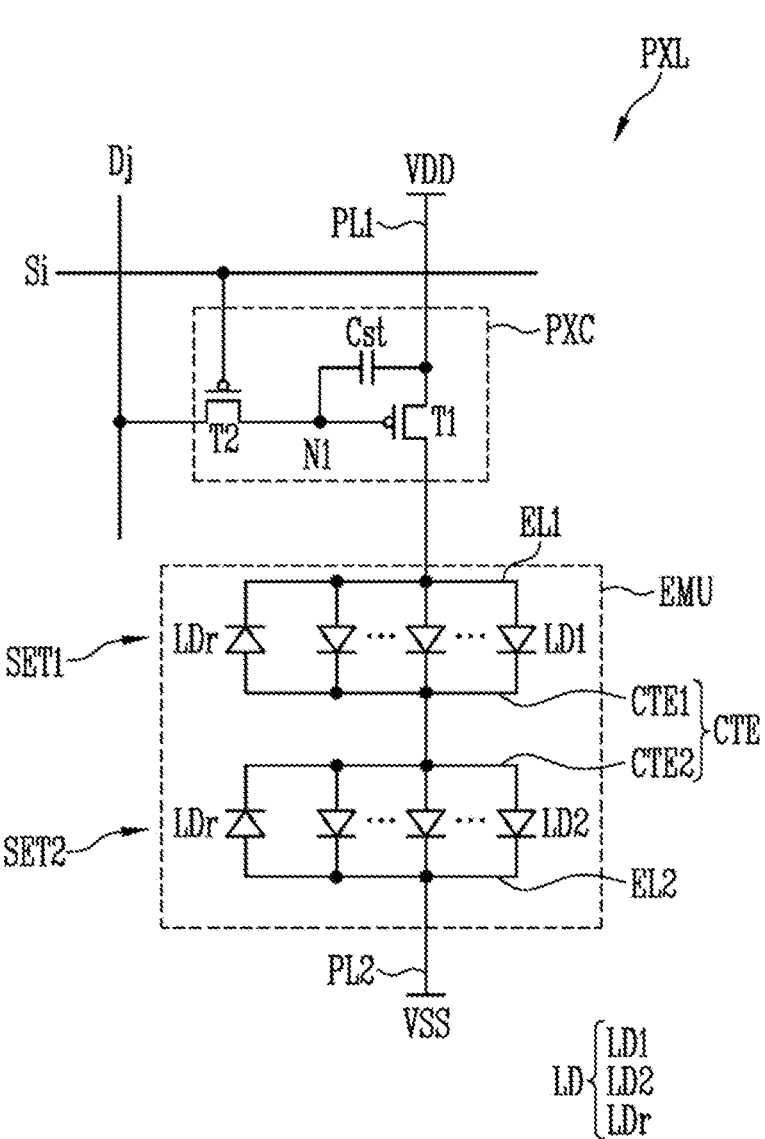
FIGS. 6A to 6C are schematic circuit diagrams illustrating an electrical connection relationship between components included in a pixel shown in FIG. 5 according to various embodiments.
Figure 6B:
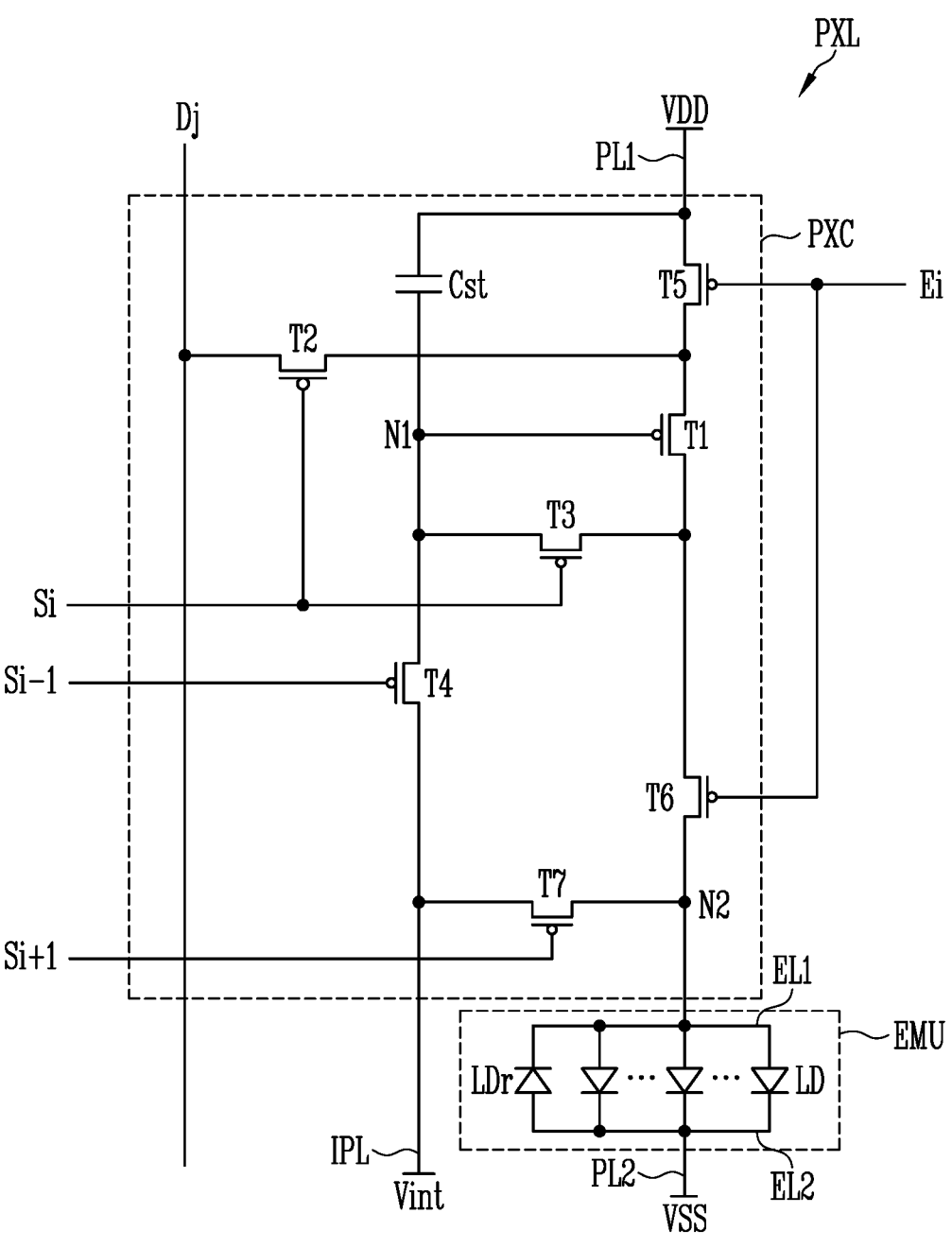
Figure 6C:
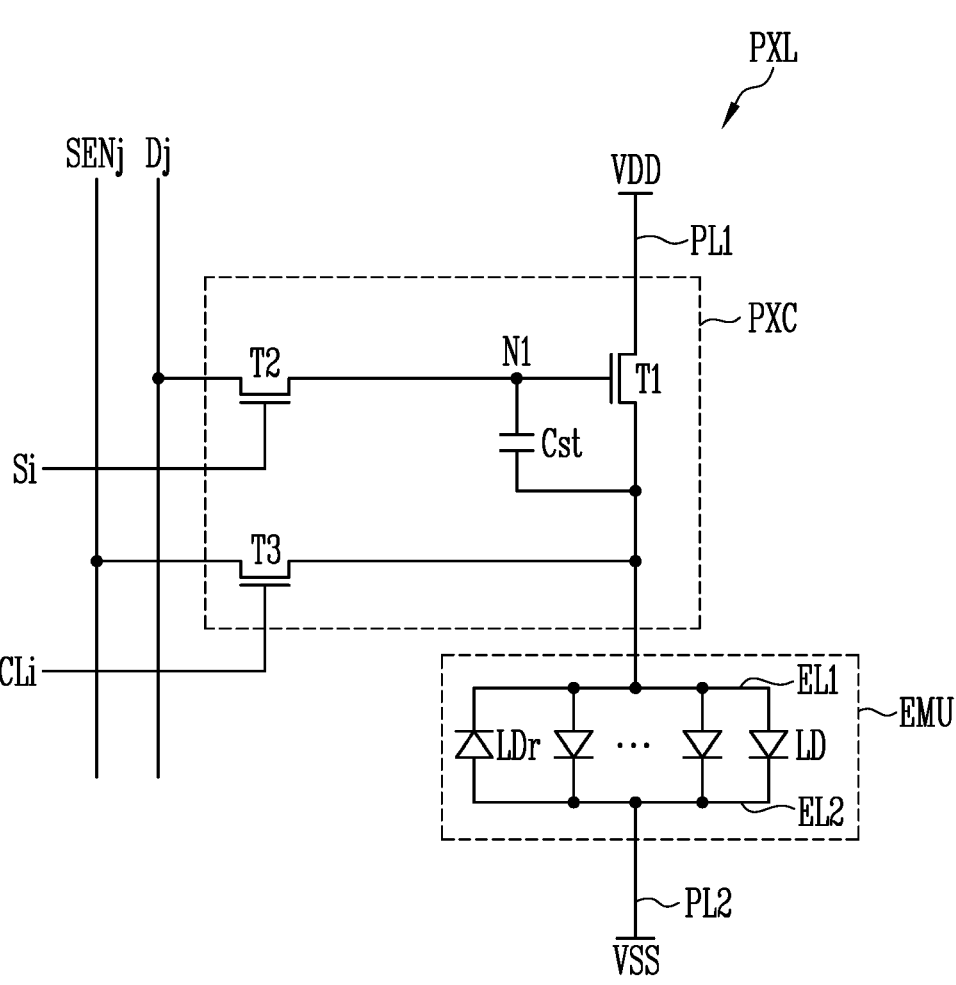

FIGS. 6A to 6C are schematic circuit diagrams illustrating an electrical connection relationship between components included in an pixel PXL shown in FIG. 5 according to various embodiments.

For example, FIGS. 6A to 6C illustrate an electrical connection relationship between the component included in the pixel PXL applicable to an active type display device according to different embodiments. However, types of the components included in the pixel PXL to which the embodiment is applicable are not limited thereto.

In FIGS. 6A to 6C, not only components included in each of the pixels PXL shown in FIG. 5 but also areas in which the components are provided (or positioned) are referred to as the pixels PXL.

Referring to FIGS. 1 to 6C, a pixel PXL (hereinafter, referred to as "pixel") may include an emission unit EMU that generates light having luminance corresponding to a data signal. The pixel PXL may selectively further include a pixel circuit PXC for driving the emission unit EMU.

The emission unit EMU may include the light-emitting elements connected in parallel between a first power line PL1 to which a voltage of a first driving power source VDD is applied and a second power line PL2 to which a voltage of a second driving power source VSS is applied. For example, the emission unit EMU may include a first electrode EL1 (or "first alignment electrode") connected to the first driving power source VDD through the pixel circuit PXC and the first power line PL1, a second electrode EL2 (or "second alignment electrode") connected to the second driving power source VSS through the second power line PL2, and the light-emitting elements LD connected in parallel in the same direction between the first electrode EL1 and the second electrode EL2. In an embodiment, the first electrode EL1 may be an anode, and the second electrode EL2 may be a cathode.

Each of the light-emitting elements LD included in the emission unit EMU may include an end portion connected to the first driving power source VDD through the first electrode EL1 and another end portion connected to the second driving power source VSS through the second electrode EL2. The first driving power source VDD and the second driving power source VSS may have different potentials. As an example, the first driving power source VDD may be set as a high potential power source, and the second driving power source VSS may be set as a low potential power source.

Each of the light-emitting element LD connected in parallel in the same direction between the first electrode EL1 and the second electrode EL2 to which voltages having different potentials are respectively supplied may constitute each effective light source. The effective light sources may be gathered to configure the emission unit EMU of the pixel PXL.

The light-emitting elements LD of the emission unit EMU may emit light with a luminance corresponding to a driving current supplied through the corresponding pixel circuit PXC. For example, during each frame period, the pixel circuit PXC may supply a driving current corresponding to a grayscale value of corresponding frame data to the emission unit EMU. The driving current supplied to the emission unit EMU may be divided to flow in the light-emitting elements LD. Accordingly, while each light-emitting element LD may emit light with luminance corresponding to a current flowing therein, the emission unit EMU may emit light with luminance corresponding to the driving current.

The emission unit EMU may further include at least one ineffective light source, for example, a reverse light-emitting element LDr in addition to the light-emitting elements LD constituting each effective light source. The reverse light-emitting element LDr may be connected in parallel with the light-emitting elements LD constituting the effective light sources between the first electrode EL1 and the second electrode EL2 and may be connected between the first electrode EL1 and the second electrode EL2 in a direction opposite to that of the light-emitting elements LD. The reverse light-emitting element LDr may be maintained an inactive state even in case that a certain driving voltage (for example, a forward driving voltage) is applied between the first electrode EL1 and the second electrode EL2, and thus a current may not substantially flow in the reverse light-emitting element LDr.

The pixel circuit PXC may be connected to a scan line Si and a data line Dj of the corresponding pixel PXL. For example, when it is assumed that the pixel PXL is disposed in an $i^{th}$ row and a $j^{th}$ column of a display area DA, wherein i is a natural number and j is a natural number, the pixel circuit PXC of the pixel PXL may be connected to an $i^{th}$ scan line Si and a $j^{th}$ data line Dj of the display area DA. According to an embodiment, the pixel circuit PXC may include first and second transistors T1 and T2 and a storage capacitor Cst. However, a structure of the pixel circuit PXC is not limited to the embodiments shown in FIGS. 6A to 6C.

First, referring to FIG. 6A, the pixel circuit PXC may include the first and second transistors T1 and T2 and the storage capacitor Cst.

A first terminal of the second transistor T2 (or a switching transistor) may be connected to the $j_{th}$ data line Dj, and a second terminal thereof may be connected to a first node N1. Here, the first terminal and the second terminal of the second transistor T2 may be different terminals. For example, in case that the first terminal is a source electrode, the second terminal may be a drain electrode. A gate electrode of the second transistor T2 may be connected to the $i^{th}$ scan line Si. In case that a scan signal having a voltage (for example, s low voltage) at which the second transistor T2 can be turned on is supplied from the $i^{th}$ scan line Si, the second transistor T2 may be turned on to electrically connect the $j^{th}$ data line Dj and the first node N1. A data signal of a corresponding frame may be supplied to the $j^{th}$ data line Dj, and thus the data signal may be transmitted to the first node N1. The data signal transmitted to the first node N1 may be charged in the storage capacitor Cst.

A first terminal of the first transistor T1 (or a driving transistor) may be connected to the first driving power source VDD, and a second terminal thereof may be connected to the first electrode EL1. A gate electrode of the first transistor T1 may be connected to the first node N1. The first transistor T1 may control an amount of a driving current supplied to the light-emitting elements LD in response to a voltage of the first node N1.

An electrode of the storage capacitor Cst may be connected to the first driving power source VDD, and another electrode thereof may be connected to the first node N1. The storage capacitor Cst may be charged with a voltage corresponding to the data signal supplied to the first node N1 and maintain the charged voltage until a data signal of a next frame is supplied.

FIG. 6A illustrates the pixel circuit PXC including the second transistor T2 for transferring a data signal into the pixel PXL, the storage capacitor Cst for storing the data signal, and the first transistor T1 for supplying a driving current corresponding to the data signal to the light-emitting elements LD.

However, the disclosure is not limited thereto, and the structure of the pixel circuit PXC may be variously changed. As an example, the pixel circuit PXC may further include other circuit elements such as at least one transistor element of a transistor element for compensating for a threshold voltage of the first transistor T1, a transistor element for initializing the first node N1, and/or a transistor element for controlling an emission time of the light-emitting elements LD and a boosting capacitor for boosting a voltage of the first node N1.

Also, although transistors included in the pixel circuit PXC, for example, both the first and second transistors T1 and T2, are illustrated in FIG. 6A as being p-type transistors, the disclosure is not limited thereto. For example, at least one of the first and second transistors T1 and T2 included in the pixel circuit PXC may be changed to an n-type transistor, or both the first and second transistors T1 and T2 may be changed to n-type transistors.

According to an embodiment, the pixel circuit PXC may be further connected to at least one scan line. As described above, in case that the pixel PXL is disposed in the $i^{th}$ pixel row of the display area DA, the pixel circuit PXC of the corresponding pixel PXL may be further connected to an $(i-1)^{th}$ scan line Si−1 and/or an $(i+1)^{th}$ scan line Si+1 as shown in FIG. 6B. According to an embodiment, the pixel circuit PXC may be further connected to a third power source in addition to the first and second driving power sources VDD and VSS. For example, the pixel circuit PXC may also be connected to an initialization power source Vint. The pixel circuit PXC may include first to seventh transistors T1 to T7 and the storage capacitor Cst.

The first terminal, for example, a source electrode, of the first transistor T1 (or the driving transistor) may be connected to the first driving power source VDD through the fifth transistor T5, and the second terminal thereof, for example, a drain electrode, may be electrically connected to an end portion of the light-emitting elements LD through the sixth transistor T6. The gate electrode of the first transistor T1 may be connected to the first node N1. The first transistor T1 controls a driving current flowing between the first driving power source VDD and the second driving power source VSS through the light-emitting elements LD in response to a voltage of the first node N1.

The second transistor T2 (or the switching transistor) may be connected between the $j^{th}$ data line Dj connected to the pixel PXL and the first terminal of the first transistor T1. The gate electrode of the second transistor T2 may be connected to the $i^{th}$ scan line Si. In case that a scan signal having a gate-on voltage (for example, a low voltage) is supplied from the $i^{th}$ scan line Si, the second transistor T2 may be turned on to electrically connect the $j^{th}$ data line Dj to the first terminal of the first transistor T1. Accordingly, in case that the second transistor T2 is turned on, a data signal supplied from the $j^{th}$ data line Dj may be transmitted to the first transistor T1.

The third transistor T3 may be connected between the second terminal of the first transistor T1 and the first node N1. A gate electrode of the third transistor T3 may be connected to the $i^{th}$ scan line Si. In case that a scan signal having a gate-on voltage is supplied from the $i^{th}$ scan line Si, the third transistor T3 may be turned on to electrically connect the second terminal of the first transistor T1 and the first node N1.

The fourth transistor T4 may be connected between the first node N1 and an initialization power line IPL to which a voltage of the initialization power source Vint is applied. A gate electrode of the fourth transistor T4 may be connected to a previous scan line, for example, the $(i-1)^{th}$ scan line Si−1. In case that a scan signal having a gate-on voltage is supplied from the $(i-1)^{th}$ scan line Si−1, the fourth transistor T4 may be turned on to transmit a voltage of the initialization power source Vint to the first node N1. Here, the initialization power source Vint may have a voltage that is less than or equal to a lowest voltage of a data signal.

The fifth transistor T5 may be connected between the first driving power source VDD and the first transistor T1. A gate electrode of the fifth transistor T5 may be connected to a corresponding emission control line, for example, an $i^{th}$ emission control line Ei. The fifth transistor T5 may be turned off when an emission control signal having a gate-off voltage is supplied to the $i^{th}$ emission control line Ei and may be turned on in other cases.

The sixth transistor T6 may be connected between the first transistor T1 and a second node N2 electrically connected to one end portion of the light-emitting elements LD. A gate electrode of the sixth transistor T6 may be connected to the $i^{th}$ emission control line Ei. The sixth transistor T6 may be turned off in case that an emission control signal having a gate-off voltage is supplied to the $i^{th}$ emission control line Ei and may be turned on in other cases.

The seventh transistor T7 may be connected between the second node N2 electrically connected to an end portion of the light-emitting element LD and the initialization power line IPL. The gate electrode of the seventh transistor T7 may be connected to at least one of scan lines of a next row, for example, the $(i+1)^{th}$ scan line Si+1. In case that a scan signal having a gate-on voltage is supplied from the $(i+1)^{th}$ scan line Si+1, the seventh transistor T7 may be turned on to supply a voltage of the initialization power source Vint to an end portion of the light-emitting elements LD.

The storage capacitor Cst may be connected between the first driving power source VDD and the first node N1. The storage capacitor Cst may store a data signal supplied to the first node N1 and a voltage corresponding to the threshold voltage of the first transistor T1 in each frame period.

Transistors included in the pixel circuit PXC, for example, all of the first to seventh transistors T1 to T7 are illustrated in FIG. 6B as being p-type transistors, but the disclosure is not limited thereto. For example, at least one of the first to seventh transistors T1 to T7 may be changed to an n-type transistor, or all of the first to seventh transistors T1 to T7 may be changed to n-type transistors.

In an embodiment, the configuration of the pixel circuit PXC is not limited to the embodiment illustrated in FIGS. 6A and 6B. As an example, the pixel circuit PXC may have a configuration as in the embodiment illustrated in FIG. 6C.

The pixel circuit PXC may be further connected to a control line CLi and a sensing line SENj as shown in FIG. 6C. For example, the pixel circuit PXC may be connected to an $i^{th}$ control line CLi and a $j^{th}$ sensing line SENj of the display area DA. The above-described pixel circuit PXC may further include the third transistor T3 in addition to the first and second transistors T1 and T2 shown in FIG. 6A. The first to third transistors T1 to T3 may be provided as n-type transistors.

The third transistor T3 may be connected between the first transistor T1 and the $j^{th}$ sensing line SENj. For example, an electrode of the third transistor T3 may be connected to the first terminal (for example, the source electrode) of the first transistor T1 connected to the first electrode EL1, and the other electrode of the third transistor T3 may be connected to the $j^{th}$ sensing line SENj.

In an embodiment, a gate electrode of the third transistor T3 may be connected to the $i^{th}$ control line CLi. The third transistor T3 may be turned on by a control signal having a gate-on voltage (for example, a high level) supplied to the $i^{th}$ control line CLi during a certain sensing period, thereby electrically connecting the $j^{th}$ sensing line SENj and the first transistor T1.

According to an embodiment, a sensing period may be a period for extracting characteristic information (for example, the threshold voltage of the first transistor T1) of each of the pixels PXL disposed in the display area DA. During the above-described sensing period, a certain reference voltage at which the first transistor T1 can be turned on may be supplied to the first node N1 through the $j^{th}$ data line Dj and the second transistor T2 or each pixel PXL may be connected to a current source, thereby turning the first transistor T1 on. Also, a control signal having a gate-on voltage may be supplied to the third transistor T3 to turn the third transistor T3 on, thereby connecting the first transistor T1 to the $j^{th}$ sensing line SENj. Accordingly, characteristic information of each pixel PXL including the threshold voltage of the first transistor T1 may be extracted through the above-described jth sensing line SENj. The extracted characteristic information may be used to convert image data such that a characteristic deviation between the pixels PXL is compensated for.

Although an embodiment in which all of the first to third transistors T1 to T3 are n-type transistors is illustrated in FIG. 6C, the disclosure is not limited thereto. For example, at least one of the first to third transistors T1 to T3 may be changed to a p-type transistor. Although an embodiment in which the emission unit EMU is connected between the pixel circuit PXC and the second driving power source VSS is illustrated in FIG. 6C, the emission unit EMU may be connected between the first driving power source VDD and the pixel circuit PXC.

Although an embodiment in which all of the light-emitting elements LD constituting each emission unit EMU are connected in parallel is illustrated in FIGS. 6B and 6C, the disclosure is not limited thereto. According to an embodiment, the emission unit EMU may be provided to include at least one series stage including the light-emitting elements LD connected in parallel with each other. For example, as shown in FIG. 6A, the emission unit EMU may be provided in a series-parallel combination structure.

Referring to FIG. 6A, the emission unit EMU may include first and second series stages SET1 and SET2 sequentially connected between the first driving power source VDD and the second driving power source VSS. The first and second series stages SET1 and SET2 may include two electrodes EL1 and CTE1 and two electrodes CTE2 and EL2 which constitutes an electrode pair of a corresponding series stage and the light-emitting elements LD connected in parallel in the same direction between the two electrodes EL1 and CTE1 and between the two electrodes CTE2 and EL2.

The first series stage SET1 may include the first electrode EL1 and a first intermediate electrode CTE1 and may include one or more first light-emitting elements LD1 connected between the first electrode EL1 and the first intermediate electrode CTE1. Also, the first series stage SET1 may include the reverse light-emitting element LDr connected in a direction opposite to that of the first light-emitting element LD1 between the first electrode EL1 and the first intermediate electrode CTE1.

The second series stage SET2 may include the second intermediate electrode CTE2 and a second electrode EL2 and one or more second light-emitting elements LD2 connected between the second intermediate electrode CTE2 and the second electrode EL2. The second series stage SET2 may include the reverse light-emitting element LDr connected in a direction opposite to that of the second light-emitting element LD2 between the second intermediate electrode CTE2 and the second electrode EL2.

The first intermediate electrode CTE1 of the first series stage SET1 and the second intermediate electrode CTE2 of the second series stage SET2 may be integrally provided to be connected to each other. For example, the first intermediate electrode CTE1 and the second intermediate electrode CTE2 may constitute an intermediate electrode CTE electrically connecting the consecutive first and second series stages SET1 and SET2. In case that the first intermediate electrode CTE1 and the second intermediate electrode CTE2 are integrally provided, the first intermediate electrode CTE1 and the second intermediate electrode CTE2 are different regions of the intermediate electrode CTE.

In an above-described embodiment, the first electrode EL1 of the first series stage SET1 may be an anode of the emission unit EMU of each pixel PXL, and the second electrode EL2 of the second series stage SET2 may be a cathode of the emission unit EMU.

As described above, in the emission unit EMU of the pixel PXL including the light-emitting elements LD connected in a series-parallel combination structure, a driving current/voltage condition can be readily adjusted according to an applied product specification.

In the emission unit EMU of the pixel PXL including the light-emitting elements LD connected in the series-parallel combination structure, a driving current can be reduced compared to an emission unit EMU having a structure in which the light-emitting elements LD are connected in parallel. In the emission unit EMU of the pixel PXL including the light-emitting elements LD connected in the series-parallel combination structure, a driving voltage applied to both ends of the emission unit EMU may be reduced compared to an emission unit EMU having a structure in which all of the light-emitting elements LD are connected in series.

The structure of the pixel PXL applicable to the disclosure is not limited to the embodiments shown in FIGS. 6A to 6C, and the pixel PXL may have various structures. For example, each pixel PXL may be provided inside a passive light-emitting display device or the like. The pixel circuit PXC may be omitted, and both end portions of the light-emitting elements LD included in the emission unit EMU may be connected directly to the $i^{th}$ scan line Si, the $j^{th}$ data line Dj, and the first power line PL1 to which a voltage of the first driving power source VDD is applied, the second power line PL2 to which a voltage of the second driving power source VSS is applied, and/or a certain control line.

Figure 7:
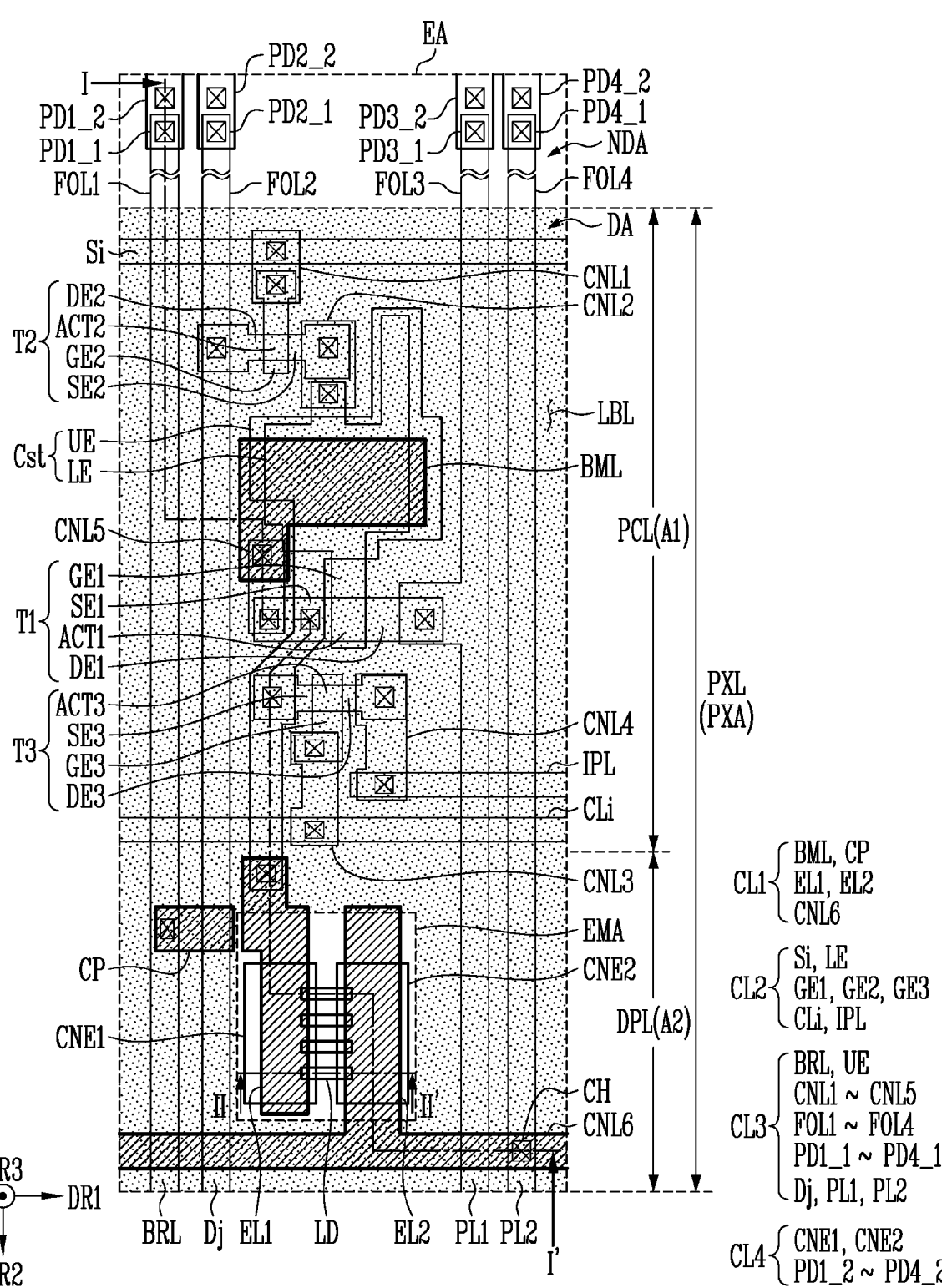
FIG. 7 is an enlarged schematic plan view of portion EA of FIG. 5.
Figure 8:
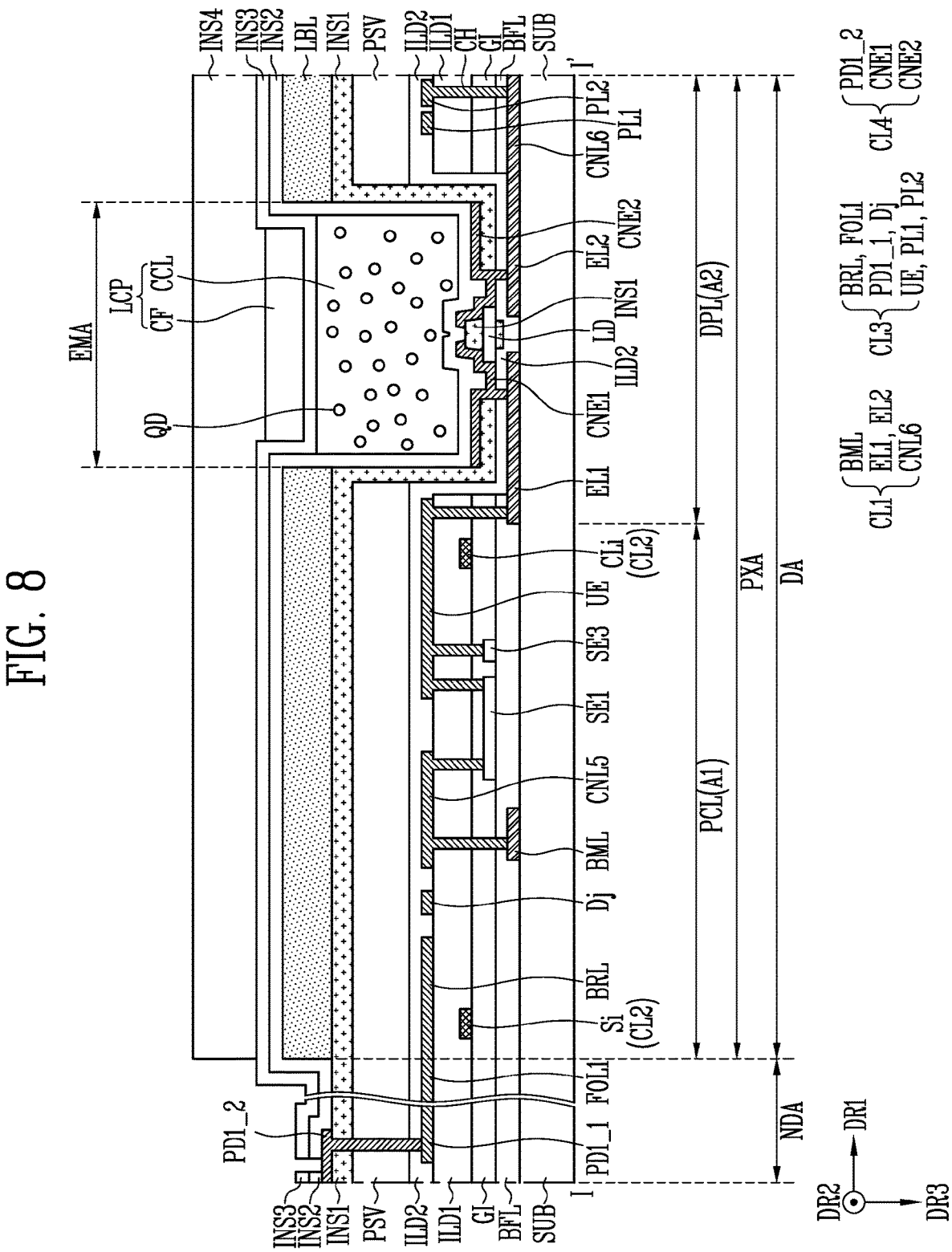
FIG. 8 is a schematic cross-sectional view taken along line I-I' of FIG. 7.
Figure 9:
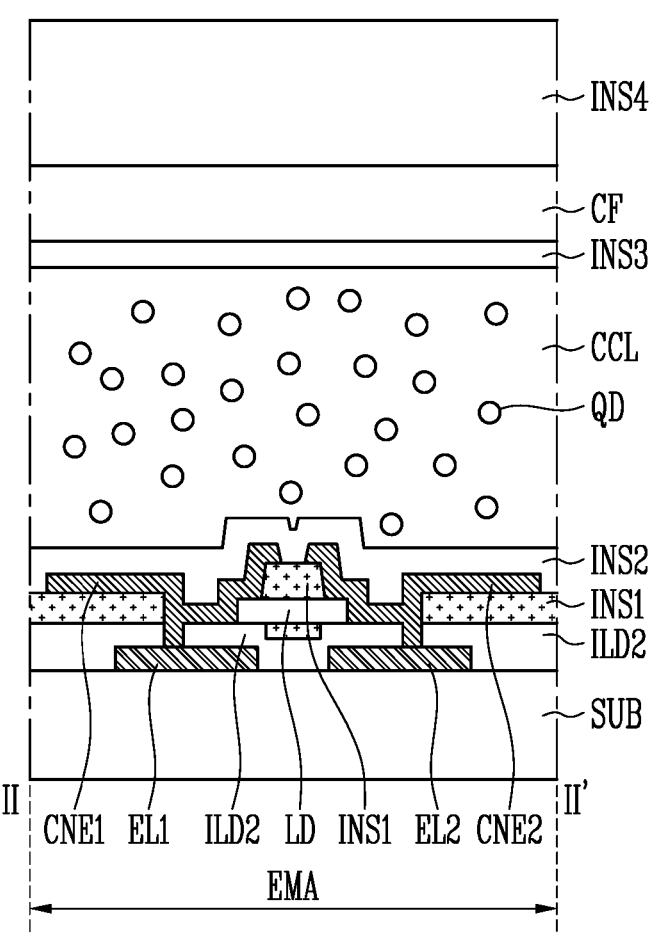
FIG. 9 is a schematic cross-sectional view taken along line II-II' of FIG. 7.
Figure 10A:
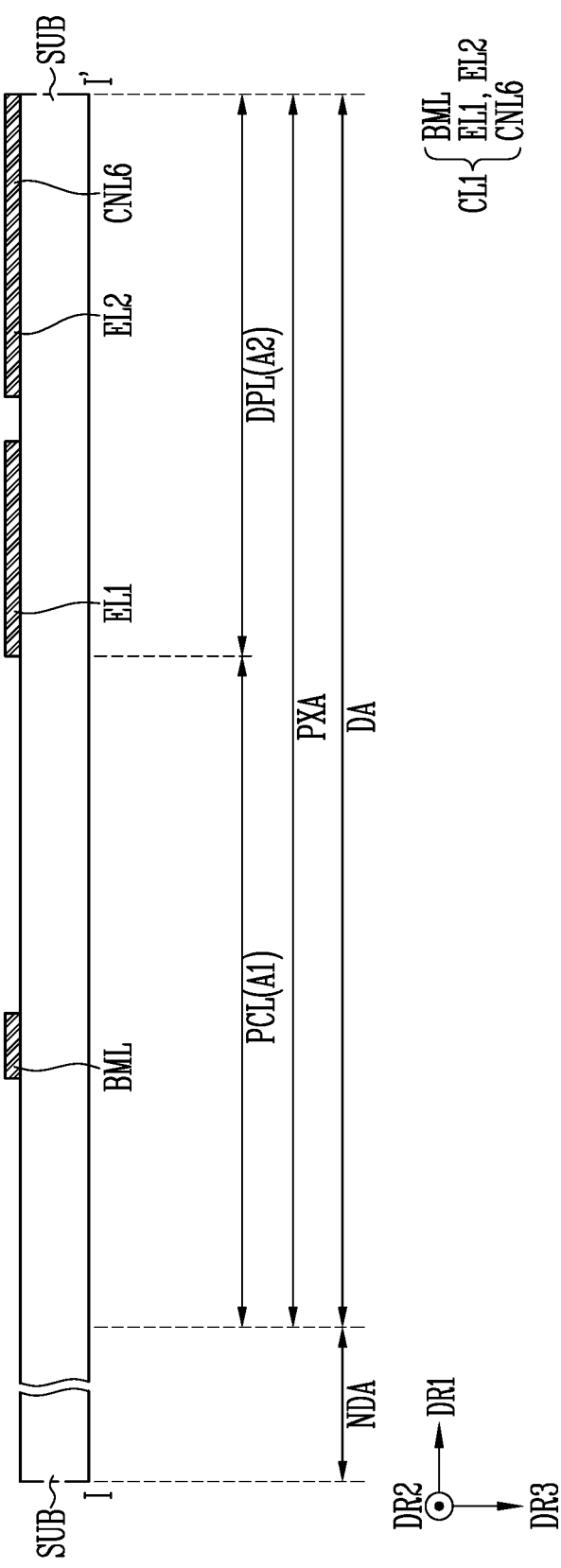
Figure 10B:
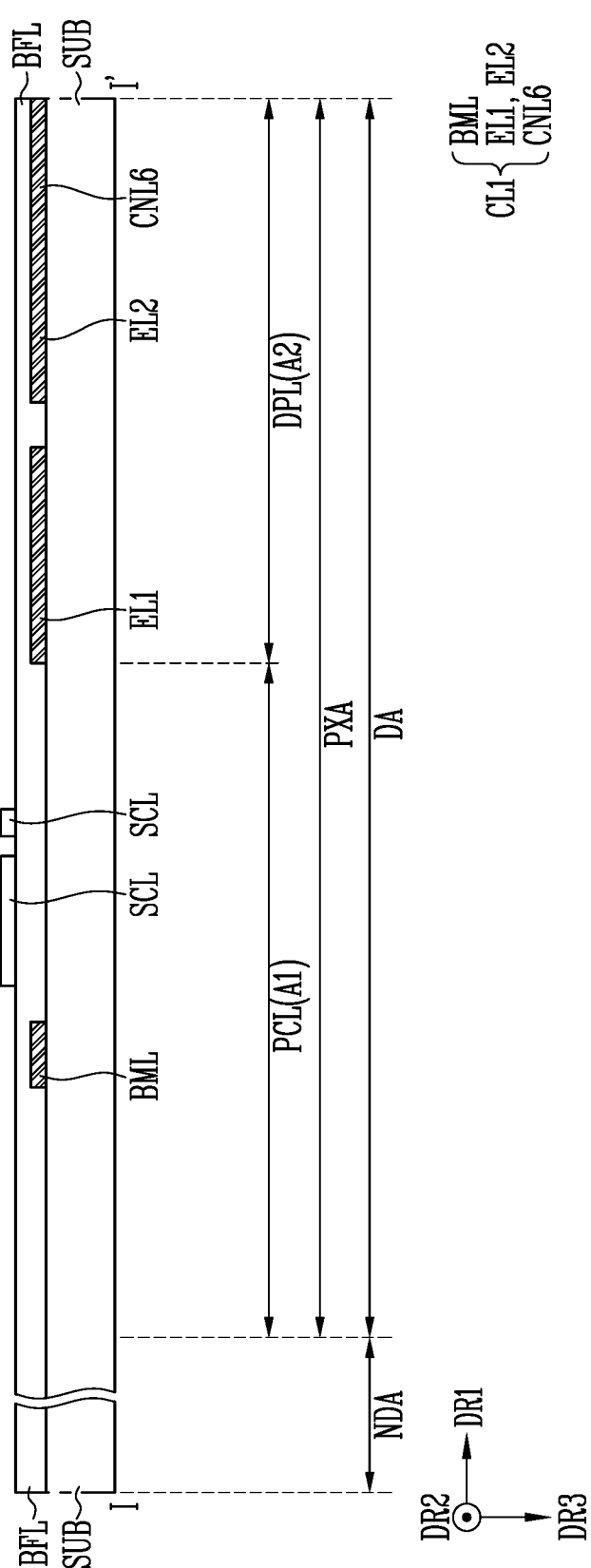
Figure 10C:
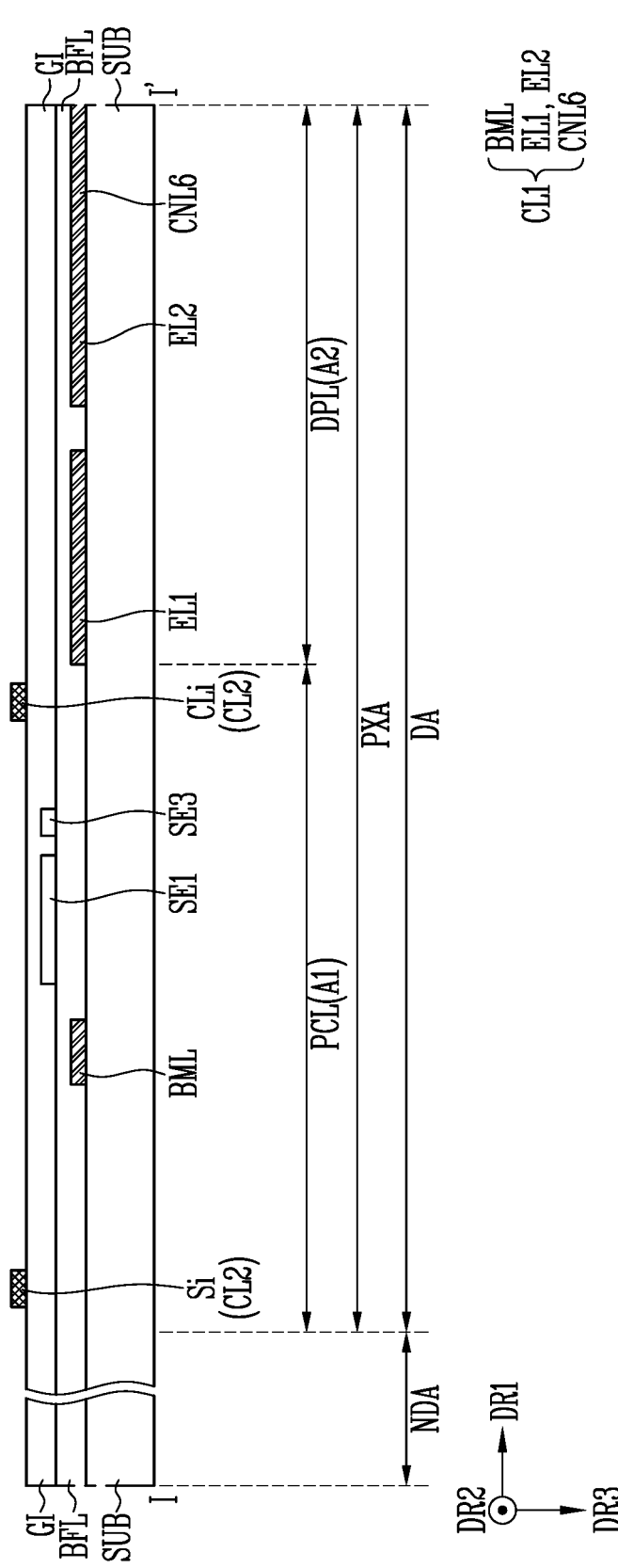
Figure 10D:
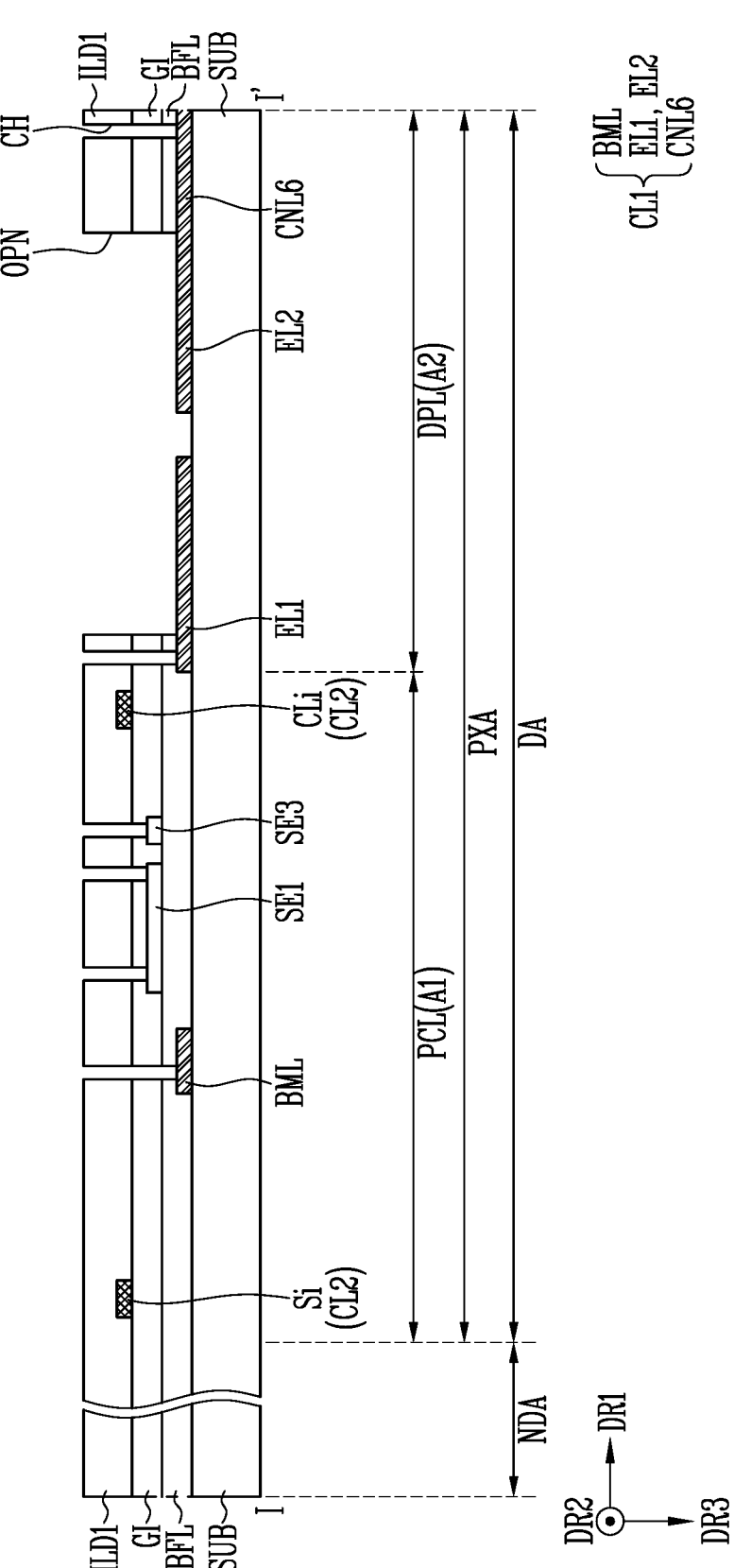
Figure 10E:
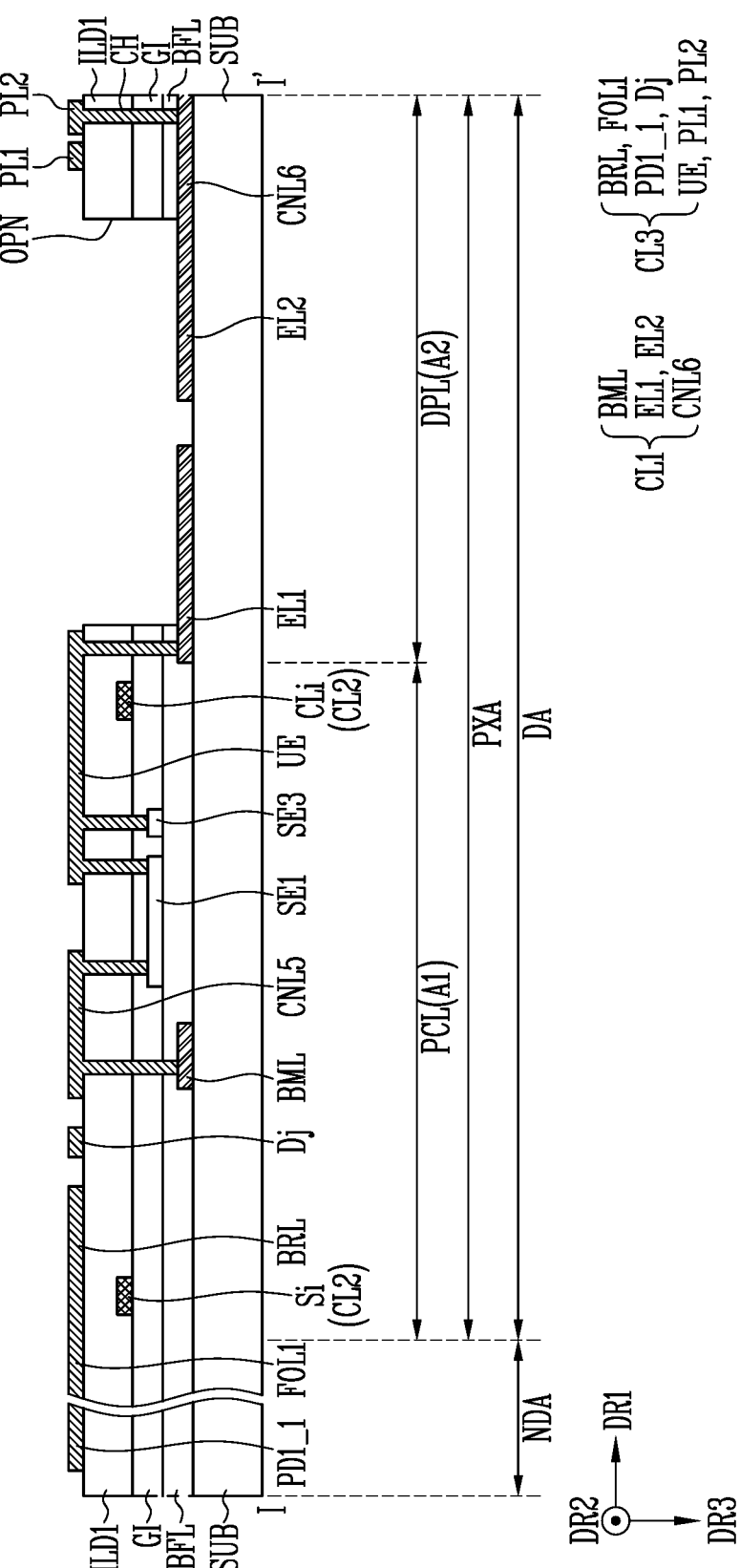
Figure 10F:
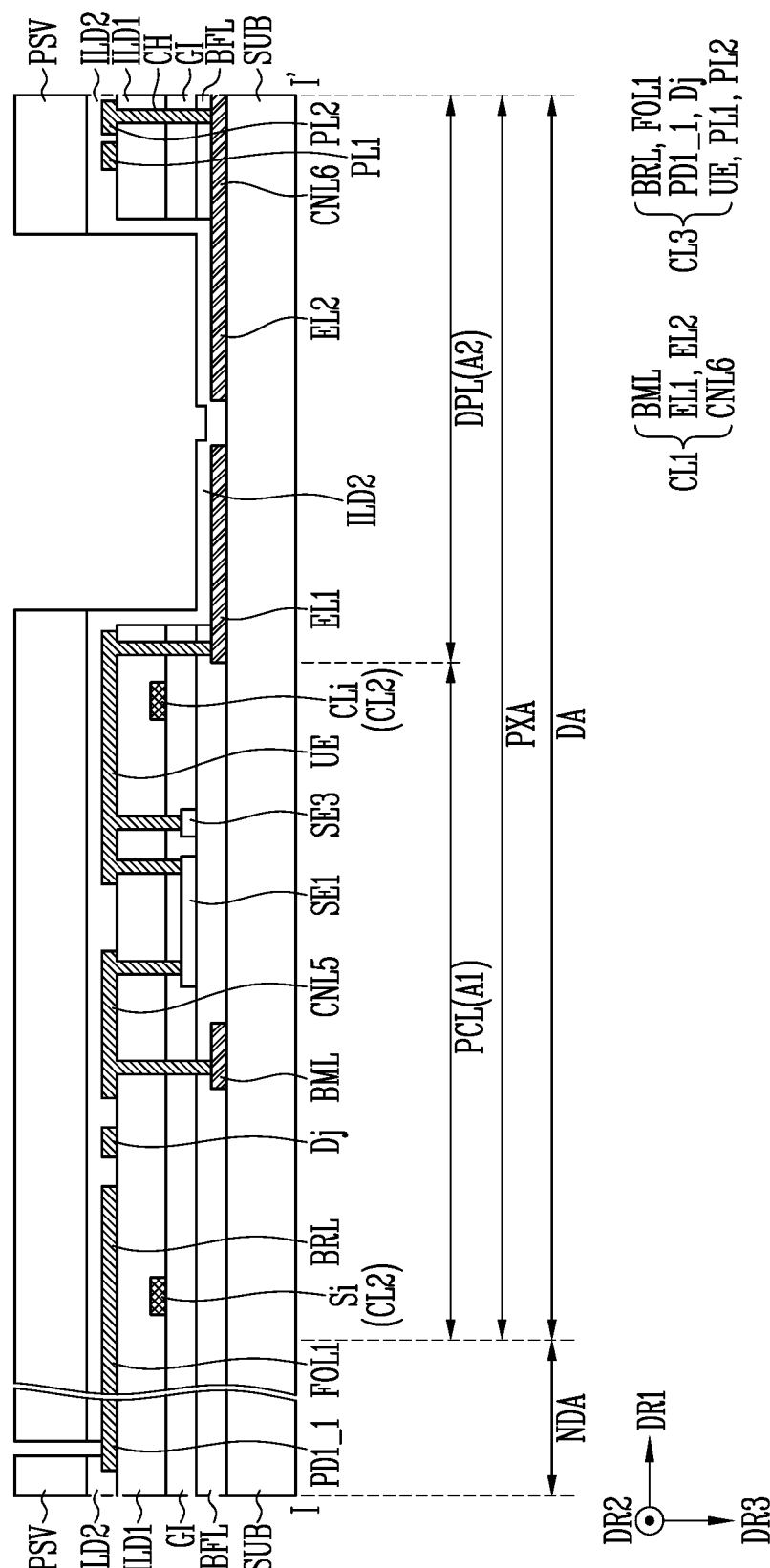
Figure 10G:
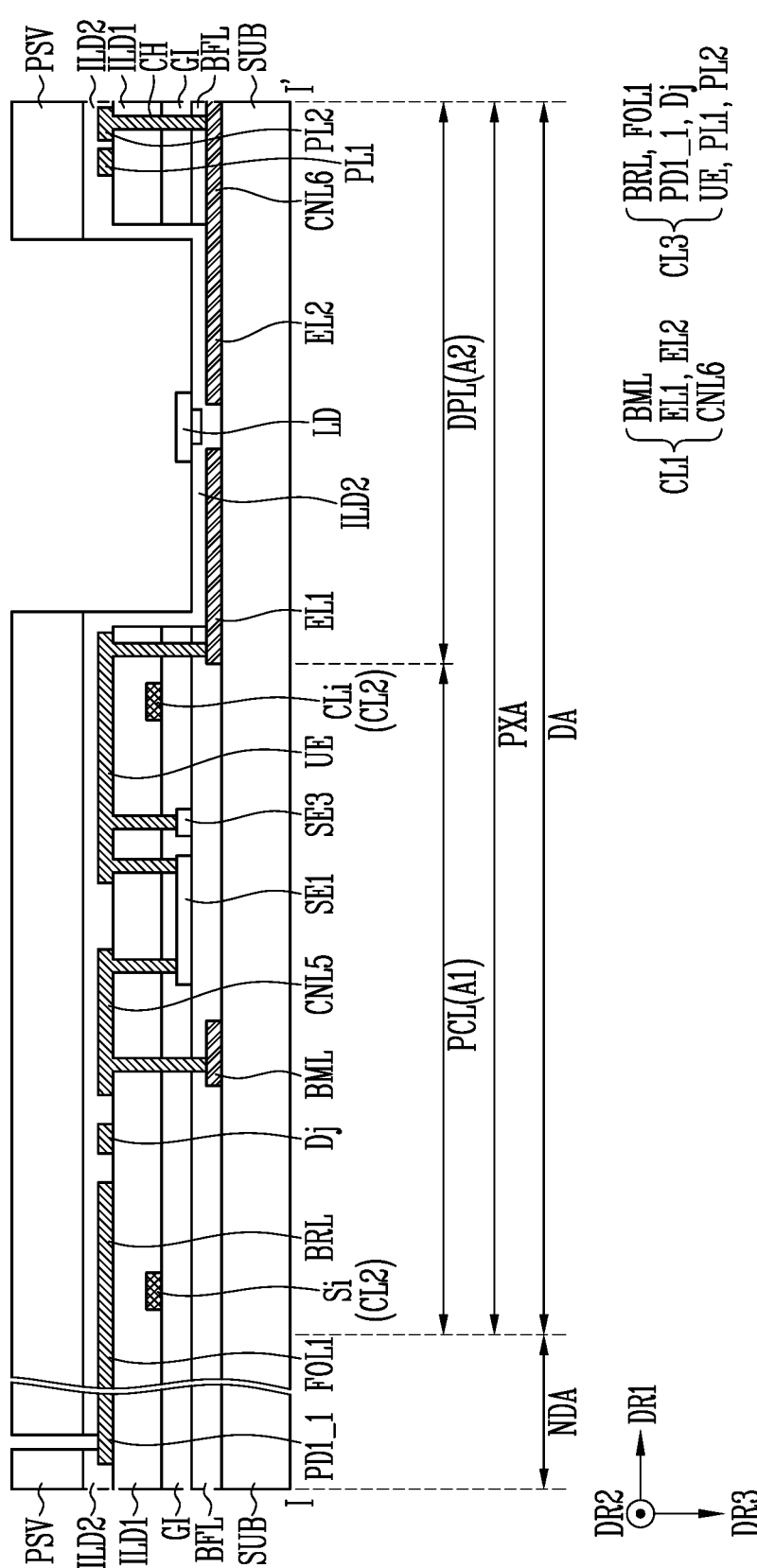
Figure 10H:
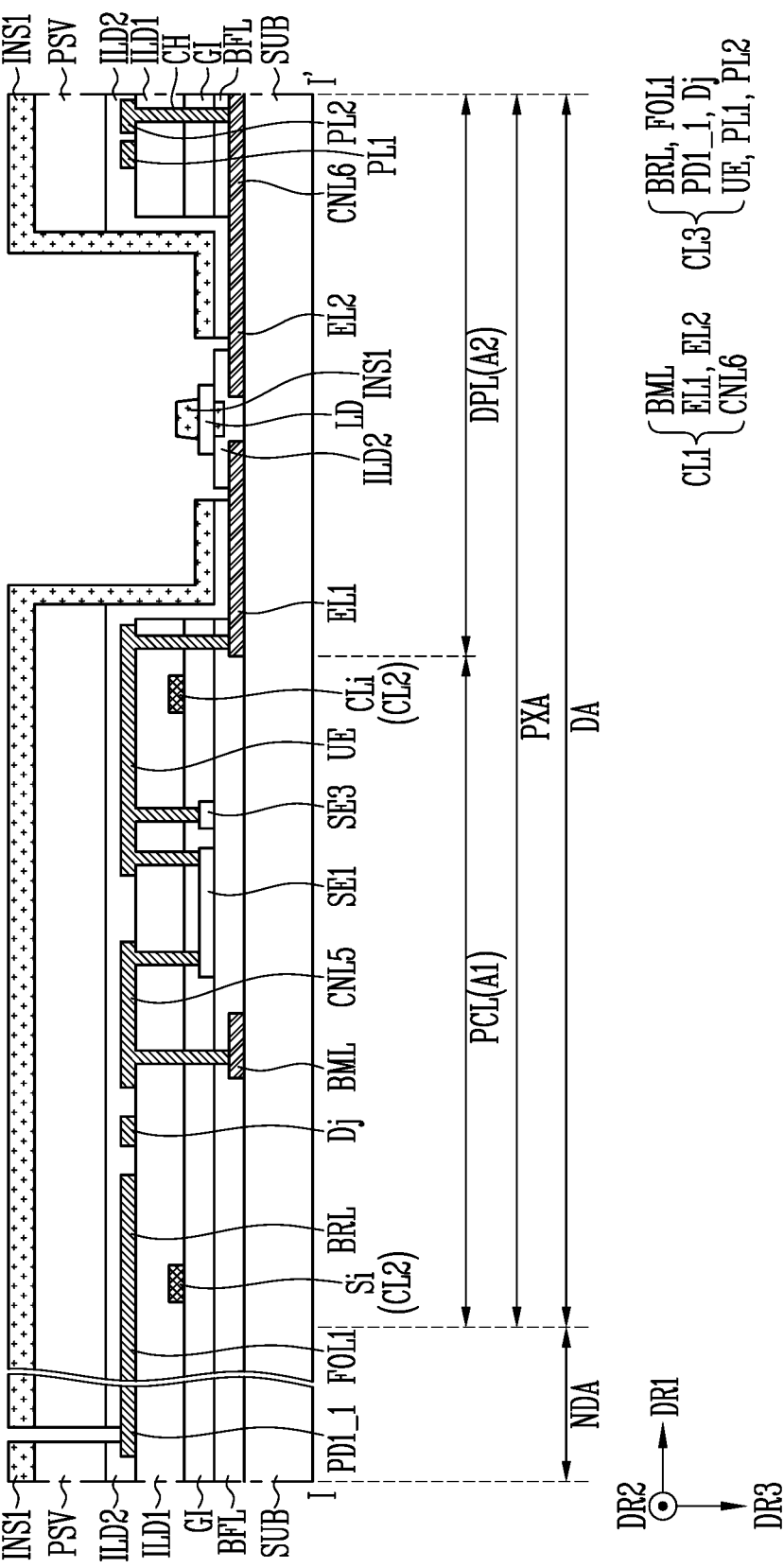
Figure 10I:
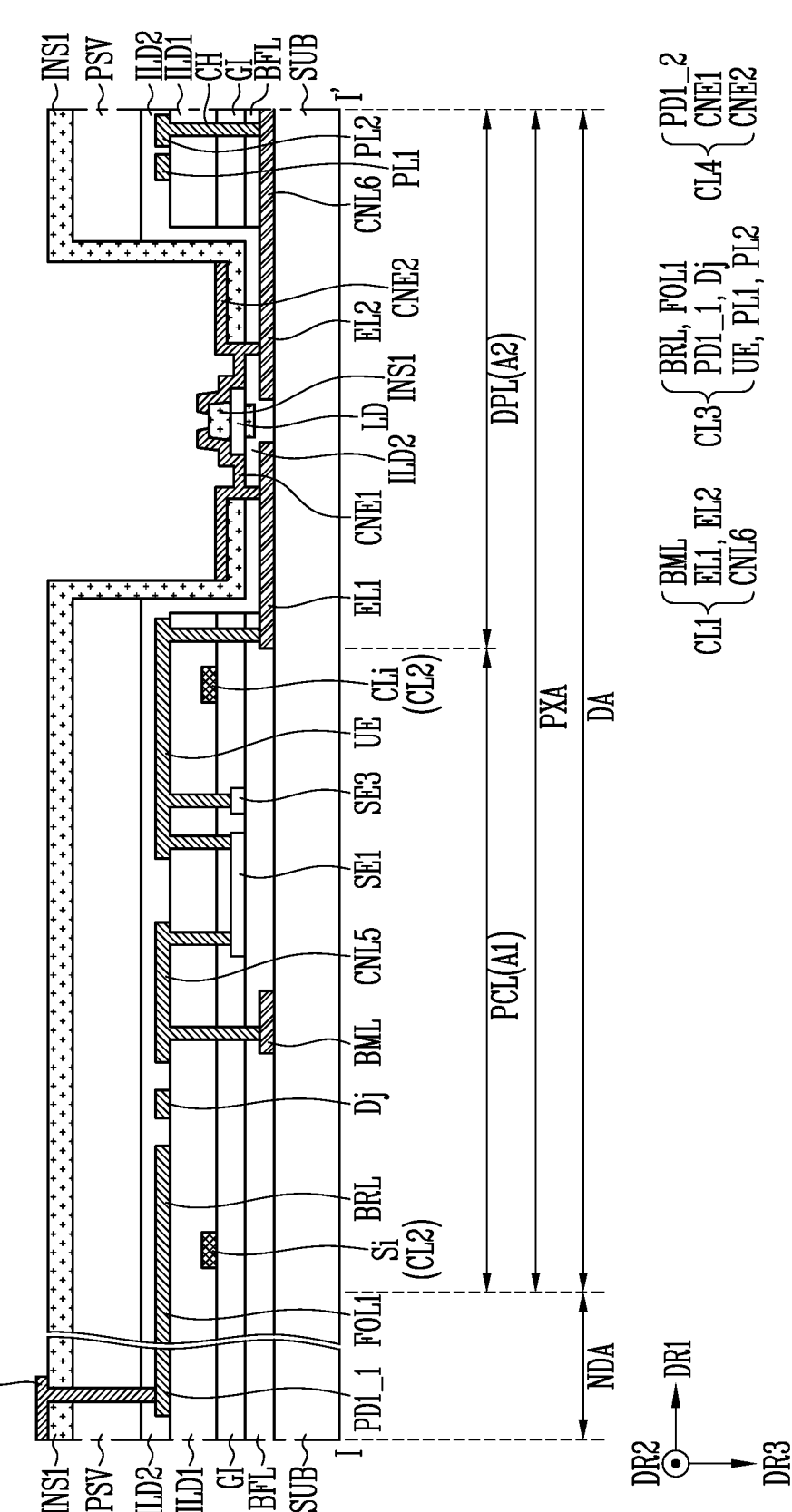
Figure 10J:
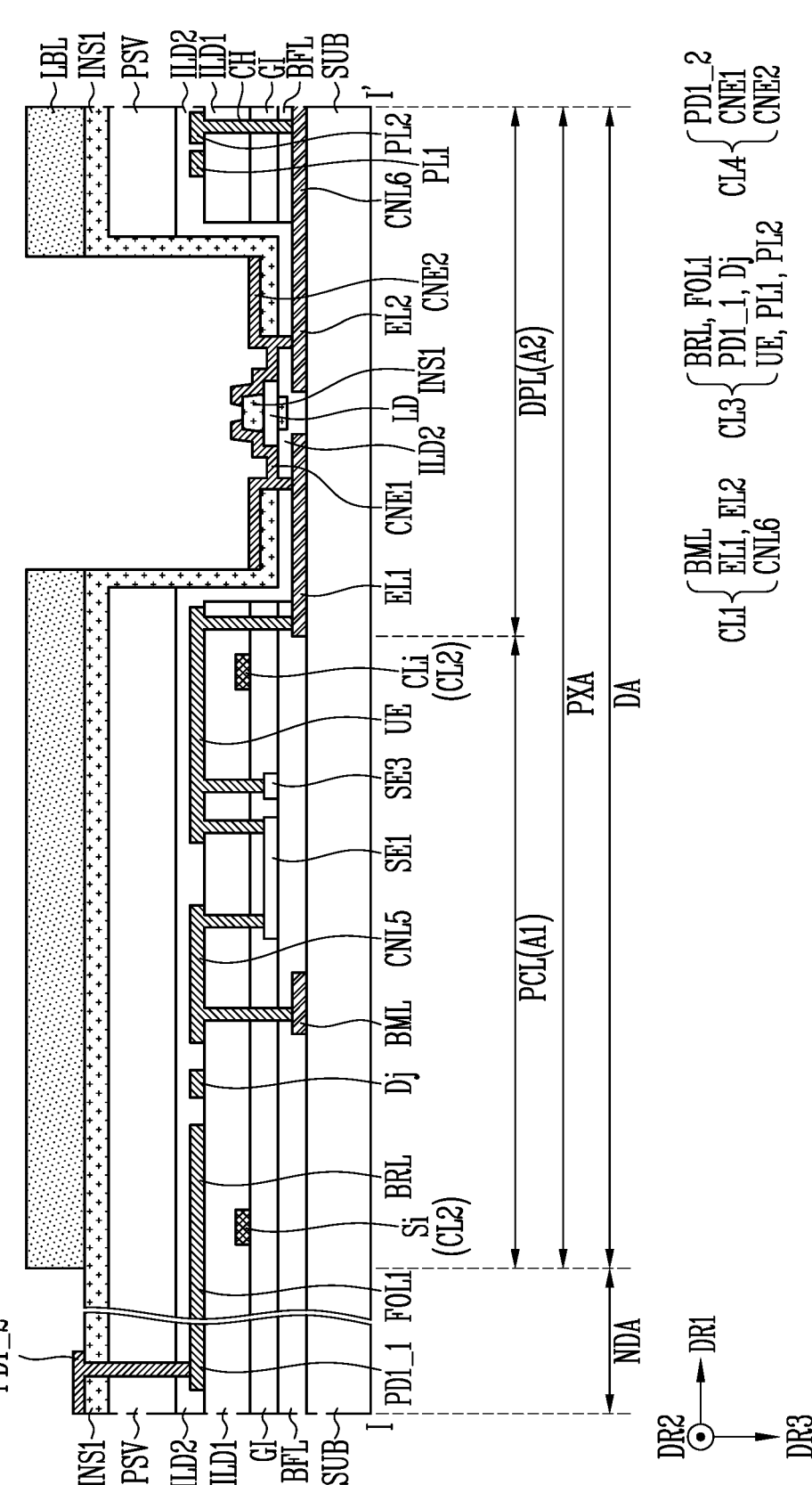
Figure 10K:
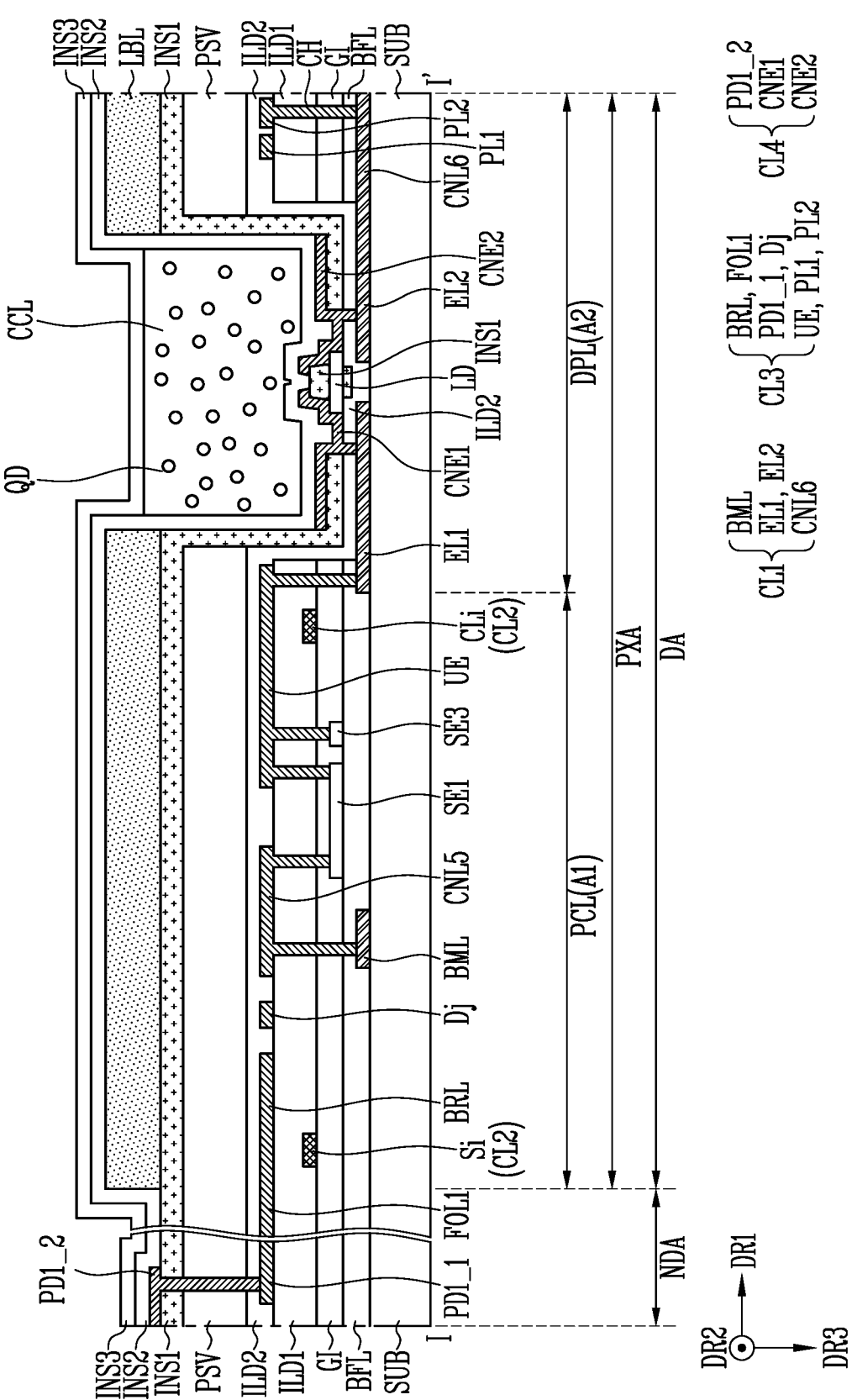
Figure 10M:
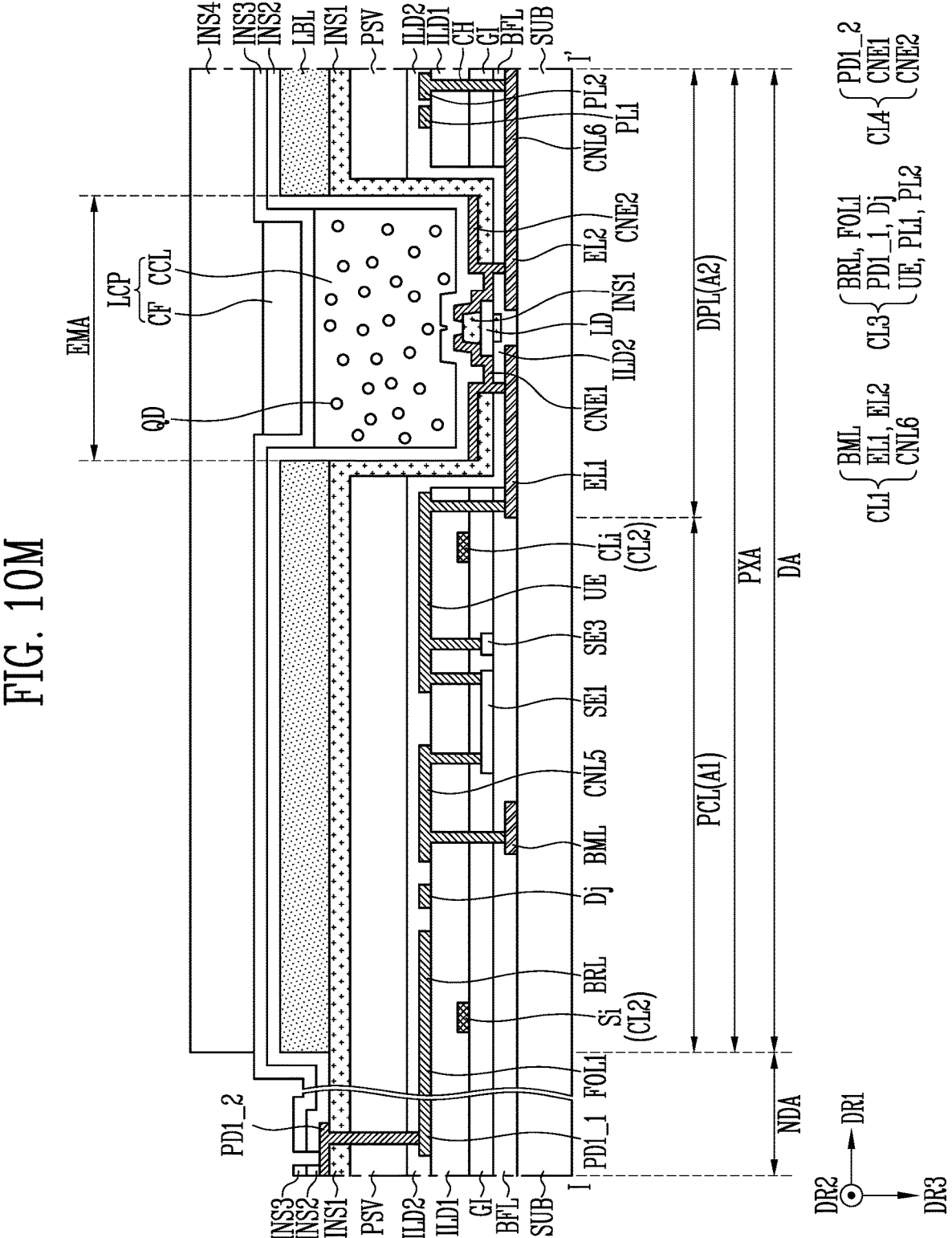

FIG. 7 is an enlarged schematic plan view of portion EA of FIG. 5. FIG. 8 is a schematic cross-sectional view taken along line I-I' of FIG. 7. FIG. 9 is a schematic cross-sectional view taken along line II-II' of FIG. 7.

A pixel shown in FIG. 7 may be a pixel described with reference to FIG. 5.

For convenience, based on one pixel PXL disposed at an intersection of a $j^{th}$ pixel column and an $i^{th}$ pixel row in portion EA, FIG. 7 illustrates a scan line Si, a control line CLi, a data line Dj, power lines PL1 and PL2, and an initialization power line IPL connected to the pixel PXL. Here, the $i^{th}$ pixel row may be a first pixel row.

For convenience of description, in lines provided in the pixel PXL, the data line Dj of a $j^{th}$ column to which a data signal may be applied is referred to as "data line Dj," a scan line of an $i^{th}$ row is referred to "scan line Si," a power line to which a voltage of a first driving power source VDD may be applied is referred to as "first power line PL1," and a power line to which a voltage of a second driving power source VSS may be applied is referred to as "second power line PL2."

In FIGS. 7 to 9, each electrode is illustrated as a single-layered electrode and each insulating layer is illustrated as only a single-layered insulating layer to simplify and illustrate the pixel PXL, but the disclosure is not limited thereto.

In an embodiment, the words "components are provided and/or formed on a same layer" may mean that the components are formed through the same process, and the words "components are provided and/or formed on different layers" may mean that the components are formed through different processes.

Furthermore, in an embodiment, the term "connection" between two components may mean that both an electrical connection and a physical connection are used inclusively.

In an embodiment, for convenience of description, a lateral direction (or horizontal direction) in a plan view is indicated by a first direction DR1, a longitudinal direction (or vertical direction) in a plan view is indicated by a second direction DR2, and a thickness of a substrate SUB in a cross section is indicated by a third direction DR3. The first to third directions DR1, DR2, and DR3 may refer to directions indicated by the first to third directions DR1, DR2, and DR3, respectively.

Referring to FIGS. 7 to 9, a display device according to an embodiment may include the substrate SUB, a line part, and pixels PXL.

The substrate SUB may include a transparent insulating material to transmit light. The substrate SUB may be a rigid substrate or a flexible substrate.

The rigid substrate may be, for example, at least one of a glass substrate, a quartz substrate, a glass ceramic substrate, and a crystalline glass substrate.

The flexible substrate may be at least one of a film substrate including a polymer organic material and a plastic substrate. For example, the flexible substrate may include at least one selected from among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a material constituting the substrate SUB may be variously changed. A material applied to the substrate SUB may have resistance (or heat resistance) against a high processing temperature during a manufacturing process of the display device.

The substrate SUB may include a display area DA including at least one pixel area PXA in which each pixel PXL is disposed and a non-display area NDA disposed around (or adjacent to) the display area DA. The pixel area PXA may include an emission area EMA from which light is emitted and a peripheral area which is adjacent to the emission area EMA (or surrounds a circumference of the emission area). In an embodiment, the peripheral area may include a non-emission area from which light is not emitted.

A line part connecting each pixel PXL and a driver may be positioned in the non-display area NDA. The line part may include multiple fan-out lines. The fan-out lines may be connected to signal lines connected to each pixel PXL. The above-described signal lines may include a data line Dj to which a data signal is applied, a scan line Si to which a scan signal is applied, a control line CLi to which a control signal is applied, an initialization power line IPL to which a voltage of an initialization power source Vint is applied, a first power line PL1 to which a voltage of a first driving power source VDD is applied, and a second power line PL2 to which a voltage of a second driving power source VSS is applied. Here, the initialization power line IPL may be the $j^{th}$ sensing line SENj described with reference to FIG. 6C.

First to fourth conductive layers CL1 to CL4 sequentially stacked on each other may be provided and/or formed on the substrate SUB. One or more insulating layers may be positioned between the first to fourth conductive layers CL1 to CL4. The insulating layers may include a buffer layer BFL provided on the substrate SUB, a gate insulating layer GI provided on the buffer layer BFL, a first interlayer insulating layer ILD1 provided on the gate insulating layer GI, a second interlayer insulating layer ILD2 provided on the first interlayer insulating layer ILD1, a protective layer PSV provided on the second interlayer insulating layer ILD2, and a first insulating layer INS1 provided on the protective layer PSV.

The first conductive layer CL1 may include a conductive material provided and/or formed on the substrate SUB. The second conductive layer CL2 may include a conductive material provided and/or formed on the gate insulating layer GI. The third conductive layer CL3 may include a conductive material provided and/or formed on the first interlayer insulating layer ILD1. The fourth conductive layer CL4 may include a conductive material provided and/or formed on the first insulating layer INS1.

The pixel PXL shown in FIG. 7 may be a pixel disposed at an intersection area of a first pixel row and a $j^{th}$ pixel column. The pixels PXL may have a substantially similar or identical structure. Accordingly, for convenience, the description of multiple pixels PXL will be replaced with the description of one pixel PXL disposed at the intersection area of the first pixel row and the $j^{th}$ pixel column with reference to FIG. 7.

The one pixel PXL (hereinafter, referred to as "pixel") may be a red pixel, a green pixel, and a blue pixel, but the disclosure is not limited thereto. The pixel PXL may be a pixel PXL disposed closest to the non-display area NDA and may be a first pixel PXL connected to the line part disposed in the non-display area NDA in the second direction DR2.

In the display area DA of the substrate SUB, an area in which the pixel PXL is disposed may be the pixel area PXA.

The pixel PXL may be electrically connected to the scan line Si, the control line CLi, the data line Dj, and the first and second power lines PL1 and PL2 positioned in the pixel area PXA. Here, the first power line PL1 may be the first power line PL1 described with reference to FIGS. 6A to 6C, and the second power line PL2 may be the second power line PL2 described with reference to FIGS. 6A to 6C.

The scan line Si may extend in the first direction DR1. The scan line Si may be one conductive layer of the above-described conductive layers. As an example, the scan line Si may be the second conductive layer CL2 provided and/or formed on the gate insulating layer GI.

The second conductive layer CL2 may be formed as a single film made of at least one selected from the group consisting of copper (Cu), molybdenum (Mo), tungsten (W), aluminum neodymium (AlNd), titanium (Ti), aluminum (Al), silver (Ag), and an alloy thereof or may be formed in a double-layer or multi-layer structure of a low-resistance material such as molybdenum (Mo), titanium (Ti), copper (Cu), aluminum (Al), and/or silver (Ag) to reduce line resistance. As an example, the second conductive layer CL2 may be formed as a double-film stacked in the order of titanium (Ti)/copper (Cu).

The gate insulating layer GI may be an inorganic insulating film including an inorganic material. The inorganic insulating film may include, for example, at least one selected from among inorganic materials such as silicon nitride ($SiN_x$), silicon oxide ($SiO_x$), silicon oxynitride ($SiO_xN_y$), and aluminum oxide ($AlO_x$). According to an embodiment, the gate insulating layer GI may be formed as an organic insulating film including an organic material. The gate insulating layer GI may be provided as a single film or may be provided as a multi-film including at least two films.

The control line CLi may extend in the same direction as the scan line Si. A control signal having a gate-on voltage (for example, a high level) may be applied to the control line CLi during a certain sensing period. In an embodiment, the control line CLi may be the second conductive layer CL2 provided and/or formed on the gate insulating layer GI.

The initialization power line IPL may extend in the same direction as the scan line Si and the control line CLi. The initialization power line IPL may be electrically connected to the corresponding pixel PXL, and a voltage of the initialization power source Vint may be applied thereto. The initialization power line IPL may be the second conductive layer CL2 provided and/or formed on the gate insulating layer GI. However, the disclosure is not limited thereto, and according to an embodiment, the initialization power line IPL may be the third conductive layer CL3 disposed on the first interlayer insulating layer ILD1.

The data line Dj may extend in the second direction DR2 that is different from, for example, intersects the first direction DR1. A corresponding data signal may be applied to the data line Dj. The data line Dj may be one conductive layer of the conductive layers provided on the substrate SUB. As an example, the data line Dj may be the third conductive layer CL3 provided on the first interlayer insulating layer ILD1.

Similar to the second conductive layer CL2, the third conductive layer CL3 may be formed as a single film made of at least one selected from the group consisting of copper (Cu), molybdenum (Mo), tungsten (W), aluminum neodymium (AlNd), titanium (Ti), aluminum (Al), silver (Ag), and an alloy thereof or may be formed in a double-layer or multi-layer structure of a low-resistance material such as molybdenum (Mo), titanium (Ti), copper (Cu), aluminum (Al), or silver (Ag) to reduce line resistance. As an example, the third conductive layer CL3 may be formed as a double-film stacked in the order of titanium (Ti)/copper (Cu).

The first interlayer insulating layer ILD1 may include the same material as the gate insulating layer GI or may include at least one material selected from among materials disclosed as structural materials of the gate insulating layer GI.

The data line Dj may be connected to a second fan-out line FOL2 included in the line part. The second fan-out line FOL2 may be the third conductive layer CL3 provided and/or formed on the first interlayer insulating layer ILD1 of the non-display area NDA. The second fan-out line FOL2 may be provided integrally with the data line Dj. An end of the second fan-out line FOL2 may be in contact with the data line Dj, and another end thereof may be in contact with a second-first pad electrode PD2_1. The second-first pad electrode PD2_1 may be provided integrally with the second fan-out line FOL2 and may electrically connect the driver implemented through a chip-on film or an integrated circuit and the corresponding pixel PXL. As an example, the second-first pad electrode PD2_1 may connect the driver and the data line Dj through the second fan-out line FOL2 to transmit a data signal to the data line Dj. According to an embodiment, the second-first pad electrode PD2_1 may be provided non-integrally with the second fan-out line FOL2 and may be electrically connected to the second fan-out line FOL2 through a separate connection such as a bridge electrode.

The first and second power lines PL1 and PL2 may extend in the same direction as the data line Dj. The first and second power lines PL1 and PL2 may be components provided on the same layer as the data line Dj. As an example, the first and second power lines PL1 and PL2 may be the third conductive layer CL3 provided on the first interlayer insulating layer ILD1. A voltage of the first driving power source VDD may be applied to the first power line PL1, and a voltage of the second driving power source VSS may be applied to the second power line PL2.

The first power line PL1 may be connected to a third fan-out line FOL3 included in the line part. The third fan-out line FOL3 may be the third conductive layer CL3 provided and/or formed on the first interlayer insulating layer ILD1 of the non-display area NDA. The third fan-out line FOL3 may be provided integrally with the first power line PL1. An end of the third fan-out line FOL3 may be in contact with the first power line PL1, and another end thereof may be in contact with a third-first pad electrode PD3_1. The third-first pad electrode PD3_1 may be provided integrally with the third fan-out line FOL3 and may electrically connect the driver and the corresponding pixel PXL. For example, the third-first pad electrode PD3_1 may connect the driver and the first power line PL1 through the third fan-out line FOL3 to transmit a voltage of the first driving power source VDD to the first power line PL1. According to an embodiment, the third-first pad electrode PD3_1 may be provided non-integrally with the third fan-out line FOL3 and may be electrically connected to the third fan-out line FOL3 through a separate connection such as a bridge electrode.

The second power line PL2 may be connected to a fourth fan-out line FOL4 included in the line part. The fourth fan-out line FOL4 may be the third conductive layer CL3 provided and/or formed on the first interlayer insulating layer ILD1 of the non-display area NDA. The fourth fan-out line FOL4 may be provided integrally with the second power line PL2. An end of the fourth fan-out line FOL4 may be in contact with the second power line PL2, and another end thereof may in contact with a fourth-first pad electrode PD4_1. The fourth-first pad electrode PD4_1 may be provided integrally with the fourth fan-out line FOL4 and may electrically connect the driver and the corresponding pixel PXL. For example, the fourth-first pad electrode PD4_1 may connect the driver and the second power line PL2 through the fourth fan-out line FOL4 to transmit a voltage of the second driving power source VSS to the second power line PL2. Also, the fourth-first pad electrode PD4_1 may transmit an alignment signal (or alignment voltage) to the second power line PL2 before light-emitting elements LD are aligned. According to an embodiment, the fourth-first pad electrode PD4_1 may be provided non-integrally with the fourth fan-out line FOL4 and may be electrically connected to the fourth fan-out line FOL4 through a separate connection means such as a bridge electrode.

The light-emitting elements LD may be positioned in the emission area EMA of the pixel area PXA, and circuit elements for driving the light-emitting elements LD may be disposed in a peripheral area of the pixel area PXA.

In an embodiment, the pixel area PXA may include a first area A1 and a second area A2 which are partitioned in one direction. A pixel circuit part PCL may be positioned in the first area A1, and a display element part DPL may be positioned in the second area A2. The second area A2 may include the emission area EMA.

For convenience, the pixel circuit part PCL will be described first, and then the display element part DPL will be described.

The pixel circuit part PCL may include a bottom metal layer BML, a buffer layer BFL, and a pixel circuit (see "PXC" in FIG. 6C) which are positioned in the first area A1 of the pixel area PXA.

The bottom metal layer BML may be provided on the substrate SUB. The bottom metal layer BML may be a light blocking layer that blocks light introduced through a rear surface of the substrate SUB from traveling to a first transistor T1 of the pixel PXL. In particular, the bottom metal layer BML may prevent a malfunction of the first transistor T1 by blocking light introduced through the rear surface of the substrate SUB from traveling to a semiconductor layer of the first transistor T1, for example, a first active pattern ACT1. To this end, the bottom metal layer BML may be positioned on the substrate SUB to overlap the first transistor T1. As an example, the bottom metal layer BML may be positioned on the substrate SUB to overlap a first gate electrode GE1 of the first transistor T1. In an embodiment, the bottom metal layer BML may be the first conductive layer CL1 provided and/or formed on the substrate SUB.

The first conductive layer CL1 may be made of a conductive material (or substance) having certain reflectance. The first conductive layer CL1 may include the same material as the second and third conductive layers CL2 and CL3 or may include at least one selected from among materials disclosed as materials of the second and third conductive layers CL2 and CL3. As an example, the first conductive layer CL1 may be formed as a single film including aluminum neodymium (AlNd).

The bottom metal layer BML may be connected to a fifth connection line CNL5 through a contact hole CH sequentially passing through the first interlayer insulating layer ILD1, the gate insulating layer GI, and the buffer layer BFL. The fifth connection line CNL5 may be the third conductive layer CL3 provided and/or formed on the first interlayer insulating layer ILD1 and may overlap the bottom metal layer BML in a plan view or cross section. The fifth connection line CNL5 may be provided on the same layer as the data line Dj and the first and second power lines PL1 and PL2, may include the same material as the data line Dj and the first and second power lines PL1 and PL2, and may be formed through the same process as the data line Dj and the first and second power lines PL1 and PL2.

An end of the fifth connection line CNL5 may be connected to the bottom metal layer BML through the contact hole CH sequentially passing through the first interlayer insulating layer ILD1, the gate insulating layer GI, and the buffer layer BFL. Also, another end of the fifth connection line CNL5 may be connected to a first source region of the first transistor T1 through a contact hole CH sequentially passing through the first interlayer insulating layer ILD1 and the gate insulating layer GI. As a result, the bottom metal layer BML may be connected to the first source region SE1 of the first transistor T1 through the fifth connection line CNL5.

As described above, in case that the bottom metal layer BML is connected to the first source region SE1 of the first transistor T1, a swing width margin of the second driving power source VSS may be secured. A driving range of a gate voltage applied to the first gate electrode GE1 of the first transistor T1 may be widened.

The buffer layer BFL may be provided and/or formed on the bottom metal layer BML. The buffer layer BFL may prevent impurities from diffusing into first to third transistors T1 to T3 included in the pixel circuit PXC. The buffer layer BFL may include an inorganic insulating film including an inorganic material. The inorganic insulating film may include, for example, at least one selected from among inorganic materials such as silicon nitride ($SiN_x$), silicon oxide ($SiO_x$), silicon oxynitride ($SiO_xN_y$), and aluminum oxide ($AlO_x$). The buffer layer BFL may be provided as a single film or may be provided as a multi-film including at least two films. In case that the buffer layer BFL is provided as the multi-film, films may be made of the same material or may be made of different materials. The buffer layer BFL may be omitted according to the material and process conditions of the substrate SUB.

The buffer layer BFL may be omitted according to a material, a process condition, or the like of the substrate SUB. The first transistor T1 may be the first transistor T1 described with reference to FIGS. 6A to 6C, the second transistor T2 may be the second transistor T2 described with reference to FIGS. 6A to 6C, and the third transistor T3 may be the third transistor T3 described with reference to FIGS. 6B and 6C.

The first transistor T1 (driving transistor) may include the first gate electrode GE1, a first active pattern ACT1, the first source region SE1, and a first drain region DE1.

The first gate electrode GE1 may be connected to a second source region SE2 of the second transistor T2 through a second connection line CNL2. The first gate electrode GE1 may be formed and/or provided on the gate insulating layer GI. The first gate electrode GE1 may be a second conductive layer CL2 provided on the gate insulating layer GI. The first gate electrode GE1 may be provided on the same layer as the scan line Si, may include the same material as the scan line Si, and may be formed through the same process as the scan line Si.

The second connection line CNL2 may be the third conductive layer CL3 provided and/or formed on the first interlayer insulating layer ILD1. The second connection line CNL2 may be provided on the same layer as the data line Dj and the first and second power lines PL1 and PL2, may include the same material as the data line Dj and the first and second power lines PL1 and PL2, and may be formed through the same process as the data line Dj and the first and second power lines PL1 and PL2. An end of the second connection line CNL2 may be connected to the first gate electrode GE1 through a contact hole CH passing through the first interlayer insulating layer ILD1. Another end of the second connection line CNL2 may be connected to the second source region SE2 through a contact hole sequentially passing through the first interlayer insulating layer ILD1 and the gate insulating layer GI.

The first active pattern ACT1, the first source region SE1, and the first drain region DE1 may be semiconductor patterns made of polysilicon, amorphous silicon, or an oxide semiconductor. The first active pattern ACT1, the first source region SE1, and the first drain region DE1 may be formed as a semiconductor layer not doped with an impurity or a semiconductor layer doped with an impurity. As an example, the first source region SE1 and the first drain region DE1 may be as a semiconductor layer doped with an impurity, and the first active pattern ACT1 may be formed as a semiconductor layer not doped with an impurity. As the impurity, for example, an n-type impurity may be used.

The first active pattern ACT1, the first source region SE1, and the first drain region DE1 may be provided and/or formed on the buffer layer BFL.

The first active pattern ACT1 may be a region overlapping the first gate electrode GE1 and may be a channel region of the first transistor T1. In case that the first active pattern ACT1 is formed to be long, the channel region of the first transistor T1 may be formed to be long. A driving range of a gate voltage (or scan signal) applied to the first transistor T1 may be widened. Accordingly, it may be possible to finely control a grayscale of light (or beam) emitted from the light-emitting elements LD.

The first source region SE1 may be connected to (or in contact with) an end of the first active pattern ACT1. Also, the first source region SE1 may be connected to a third source region SE3 of the third transistor T3 through an upper electrode UE.

The upper electrode UE may be an electrode constituting a storage capacitor Cst. The upper electrode UE may be formed of the third conductive layer CL3 provided and/or formed on the first interlayer insulating layer ILD1. The upper electrode UE may be connected to the first source region SE1 through a contact hole CH sequentially passing through the first interlayer insulating layer ILD1 and the gate insulating layer GI. The upper electrode UE may be connected to the third source region SE3 of the third transistor T3 through a contact hole CH sequentially passing through the first interlayer insulating layer ILD1 and the gate insulating layer GI. The upper electrode UE may be connected to some components of the display element part DPL through contact holes CH sequentially passing through the first interlayer insulating layer ILD1, the gate insulating layer GI, and the buffer layer BFL. A detailed description thereof will be provided below with reference to the display element part DPL.

In an above-described embodiment, it has been described that the upper electrode UE is the third conductive layer CL3 provided and/or formed on the first interlayer insulating layer ILD1, but the disclosure is not limited thereto. According to an embodiment, in case that an additional insulating layer is disposed between the gate insulating layer GI and the first interlayer insulating layer ILD1, the upper electrode UE may be formed of a conductive layer provided and/or formed on the additional insulating layer.

The first drain region DE1 may be connected to (or in contact with) another end of the first active pattern ACT1. Also, the first drain region DE1 may be connected to the first power line PL1 through a contact hole CH sequentially passing through the first interlayer insulating layer ILD1 and the gate insulating layer GI. Accordingly, a voltage of the first driving power source VDD may be applied to the first drain region DE1.

The second transistor T2 (switching transistor) may include a second gate electrode GE2, a second active pattern ACT2, the second source region SE2, and a second drain region DE2.

The second gate electrode GE2 may be connected to the scan line Si through a first connection line CNL1. The second gate electrode GE2 may be the second conductive layer CL2 provided and/or formed on the gate insulating layer GI. Like the first gate electrode GE1, the second gate electrode GE2 may be provided on the same layer as the scan line Si, may include the same material as the scan line Si, and may be formed through the same process as the scan line Si.

The first connection line CNL1 may be the third conductive layer CL3 provided and/or formed on the first interlayer insulating layer ILD1. An end of the first connection line CNL1 may be connected to the scan line Si through a contact hole CH passing through the first interlayer insulating layer ILD1. Also, another end of the first connection line CNL1 may be connected to the second gate electrode GE2 through a contact hole CH passing through the first interlayer insulating layer ILD1.

In an above-described embodiment, it has been described that the second gate electrode GE2 is provided non-integrally with the scan line Si and is connected to the scan line Si through a separate connection, for example, the first connection line CNL1, but the disclosure is not limited thereto. According to an embodiment, the second gate electrode GE2 may be provided integrally with the scan line Si. The second gate electrode GE2 may be provided as a portion of the scan line Si or may be provided in a shape protruding from the scan line Si.

The second active pattern ACT2, the second source region SE2, and the second drain region DE2 may be semiconductor patterns made of polysilicon, amorphous silicon, oxide semiconductor, and/or the like. The second active pattern ACT2, the second source region SE2, and the second drain region DE2 may be formed as a semiconductor layer not doped with an impurity or a semiconductor layer doped with an impurity. As an example, the second source region SE2 and the second drain region DE2 may be as a semiconductor layer doped with an impurity, and the second active pattern ACT2 may be formed as a semiconductor layer not doped with an impurity. As the impurity, for example, an n-type impurity may be used.

The second active pattern ACT2, the second source region SE2, and the second drain region DE2 may be provided and/or formed on the buffer layer BFL.

The second active pattern ACT2 may be a region overlapping the second gate electrode GE2 and may be a channel region of the second transistor T2.

The second source region SE2 may be connected to (or in contact with) an end of the second active pattern ACT2. Also, the second source region SE2 may be connected to the first gate electrode GE1 through the second connection line CNL2.

The second drain region DE2 may be connected to (or in contact with) another end of the second active pattern ACT2. Also, the second drain region DE2 may be connected to the data line Dj through a contact hole CH sequentially passing through the gate insulating layer GI and the first interlayer insulating layer ILD1. Accordingly, a data signal applied to the data line Dj may be transmitted to the second drain region DE2.

The third transistor T3 may include a third gate electrode GE3, a third active pattern ACT3, the third source region SE3, and a third drain region DE3.

The third gate electrode GE3 may be connected to the control line CLi through a third connection line CNL3. The third gate electrode GE3 may be the second conductive layer CL2 provided and/or formed on the gate insulating layer GI. The third gate electrode GE3 may be provided on the same layer as the scan line Si, the control line CLi, and the first and second gate electrodes GE1 and GE2, may include the same material as the scan line Si, the control line CLi, and the first and second gate electrodes GE1 and GE2, and may be formed through the same process as the scan line Si, the control line CLi, and the first and second gate electrodes GE1 and GE2.

The third connection line CNL3 may be the third conductive layer CL3 provided and/or formed on the first interlayer insulating layer ILD1. An end of the third connection line CNL3 may be connected to the third gate electrode GE3 through a contact hole CH passing through the first interlayer insulating layer ILD1. Also, another end of the third connection line CNL3 may be connected to the control line CLi through a contact hole CH passing through the first interlayer insulating layer ILD1.

In an above-described embodiment, it has been described that the third gate electrode GE3 is provided non-integrally with the control line CLi and is connected to the control line CLi through a separate connection, for example, the third connection line CNL3, but the disclosure is not limited thereto. According to an embodiment, the third gate electrode GE3 may be provided as a portion of the control line CLi or may be provided in a shape protruding from the control line CLi.

The third active pattern ACT3, the third source region SE3, and the third drain region DE3 may be semiconductor patterns made of polysilicon, amorphous silicon, oxide semiconductor, and/or the like. The third active pattern ACT3, the third source region SE3, and the third drain region DE3 may be formed as a semiconductor layer not doped with an impurity or a semiconductor layer doped with an impurity. As an example, the third source region SE3 and the third drain region DE3 may be as a semiconductor layer doped with an impurity, and the third active pattern ACT3 may be formed as a semiconductor layer not doped with an impurity. As the impurity, for example, an n-type impurity may be used.

The third active pattern ACT3, the third source region SE3, and the third drain region DE3 may be provided and/or formed on the buffer layer BFL.

The third active pattern ACT3 may be a region overlapping the third gate electrode GE3 and may be a channel region of the third transistor T3.

The third source region SE3 may be connected to (or in contact with) an end of the third active pattern ACT3. Also, the third source region SE3 may be connected to the first source region SE1 through the upper electrode UE and a corresponding contact hole CH.

The third drain region DE3 may be connected to (or in contact with) another end of the third active pattern ACT3. Also, the third drain region DE3 may be connected to the initialization power line IPL through a fourth connection line CNL4.

The fourth connection line CNL4 may be the third conductive layer CL3 provided and/or formed on the first interlayer insulating layer ILD1. An end of the fourth connection line CNL4 may be connected to the third drain region DE3 through a contact hole CH sequentially passing through the first interlayer insulating layer ILD1 and the gate insulating layer GI. Another end of the fourth connection line CNL4 may be connected to the initialization power line IPL through a contact hole CH passing through the first interlayer insulating layer ILD1.

The storage capacitor Cst may include a lower electrode LE and the upper electrode UE.

The lower electrode LE may be the second conductive layer CL2 provided and/or formed on the gate insulating layer GI. The lower electrode LE may be provided integrally with the first gate electrode GE1. In case that the lower electrode LE is provided integrally with the first gate electrode GE1, the lower electrode LE may be a region of the first gate electrode GE1.

The upper electrode UE may be disposed to overlap the lower electrode LE and may have an area that is greater than that of the lower electrode LE. In a plan view, a portion of the upper electrode UE may extend in the second direction DR2 and may overlap each of the first and third source regions SE1 and SE3. The upper electrode UE may be connected to the first and third source regions SE1 and SE3 through corresponding contact holes CH. Also, the upper electrode UE may be connected to the bottom metal layer BML through a corresponding contact hole CH.

A bridge line BRL may be further disposed in the pixel area PXA of the pixel PXL.

The bridge line BRL may be the third conductive layer CL3 provided and/or formed on the first interlayer insulating layer ILD1. In a plan view, the bridge line BRL may extend in the same direction as the data line Dj and may be spaced apart from the data line Dj in the first direction DR1.

The bridge line BRL may be connected to a first fan-out line FOL1 included in the line part of the non-display area NDA. The first fan-out line FOL1 may be the third conductive layer CL3 provided and/or formed on the first interlayer insulating layer ILD1 of the non-display area NDA. The first fan-out line FOL1 may be provided integrally with the bridge line BRL. An end of the first fan-out line FOL1 may be in contact with the bridge line BRL and another end thereof may be in contact with a first-first pad electrode PD1_1. The first-first pad electrode PD1_1 may be provided integrally with the first fan-out line FOL1 and may electrically connect the driver and the corresponding pixel PXL. As an example, the first-first pad electrode PD1_1 may connect the driver and a conductive pattern CP through the first fan-out line FOL1 and the bridge line BRL. The first-first pad electrode PD1_1, the first fan-out line FOL1, and the bridge line BRL may be used as alignment signal supply for supplying an alignment signal (or alignment voltage) to the conductive pattern CP in case that the light-emitting elements LD are aligned in the pixel area PXA.

The above-described bridge line BRL may be connected to the conductive pattern CP through a contact hole CH sequentially passing through the first interlayer insulating layer ILD1, the gate insulating layer GI, and the buffer layer BFL. In case that the light-emitting elements LD are aligned in the pixel area PXA, the conductive pattern CP may maintain a state of being connected to a first electrode EL1, and after the light-emitting elements LD are aligned, the conductive pattern CP may be partially removed in a process to be separated from (or electrically separated from) the first electrode EL1. In case that the light-emitting elements LD are aligned in the pixel area PXA, the bridge line BRL may transmit a certain alignment signal (or alignment voltage) to the first electrode EL1 through a corresponding contact hole CH and the conductive pattern CP, thereby allowing the first electrode EL1 to serve as a first alignment electrode (or first alignment line). According to an embodiment, after the light-emitting elements LD are aligned, certain signals necessary for driving the pixel PXL may be applied to the bridge line BRL.

The second interlayer insulating layer ILD2 may be provided and/or formed on the third conductive layer CL3. As an example, the second interlayer insulating layer ILD2 may be provided and/or formed on the data line Dj, the first and second power lines PL1 and PL2, the bridge line BRL, the upper electrode UE, the first to fifth connection lines CNL1 to CNL5, the first to fourth fan-out lines FOL1 to FOL4, and the first-first to fourth-first pad electrodes PD1_1 to PD4_1.

The second interlayer insulating layer ILD2 may include the same material as the gate insulating layer GI or may include at least one material selected from among materials disclosed as structural materials of the gate insulating layer GI. According to an embodiment, the second interlayer insulating layer ILD2 may include an organic insulating film including an organic material.

The protective layer PSV may be provided and/or formed on the second interlayer insulating layer ILD2.

The protective layer PSV may be provided in a form including an organic insulating film, an inorganic insulating film, or an organic insulating film disposed on the inorganic insulating film. The inorganic insulating film may include, for example, at least one selected from among inorganic materials such as silicon oxide ($SiO_x$), silicon nitride ($SiN_x$), silicon oxynitride ($SiO_xN_y$), and aluminum oxide ($AlO_x$). For example, the organic insulating film may include at least one selected from among an acrylic-based resin (polyacrylate resin), an epoxy-based resin, a phenolic-based resin, a polyamide-based resin, a polyimide-based resin, an unsaturated polyester-based resin, a poly-phenylen ether-based resin, a poly-phenylene sulfide-based resin, and a benzocyclobutene resin.

In an above-described embodiment, the bridge line BRL, the data line Dj, and the first and second power lines PL1 and PL2 may be components provided in both the first and second areas A1 and A2 of the pixel area PXA.

The first insulating layer INS1 may be provided and/or formed on the protective layer PSV. The first insulating layer INS1 may be an inorganic insulating film including an inorganic material or an organic insulating film including an organic material.

A light blocking layer LBL may be provided and/or formed on the first insulating layer INS1. The light blocking layer LBL may include a light blocking material that prevents a light leakage defect in which light (or beam) leaks between the pixel PXL and the pixels PXL adjacent thereto. The light blocking layer LBL may be a black matrix. The light blocking layer LBL may prevent color mixing of light emitted from each of adjacent pixels PXL. According to an embodiment, the light blocking layer LBL may be provided to include at least one light blocking material and/or a reflective material and allow light emitted from the light-emitting element LD positioned in the second area A2 of the pixel area PXA to further travel in an image display direction of the display device, thereby improving light emitting efficiency of the light-emitting elements LD.

The above-described light blocking layer LBL may be provided in an area of the display area DA except for the emission area EMA and the non-display area NDA in the pixel area PXA.

Second and third insulating layers INS2 and INS3 may be sequentially provided and/or formed on the light blocking layer LBL.

The second insulating layer INS2 may be a protective layer for protecting the light blocking layer LBL. The second insulating layer INS2 may be an inorganic insulating film including an inorganic material or an organic insulating film including an organic material. The third insulating layer INS3 may be provided and/or formed on the second insulating layer INS2 and may include the same material as the second insulating layer INS2.

In the non-display area NDA, the second insulating layer INS2 may be provided on first-second to fourth-second pad electrodes PD1_2 to PD4_2.

The first-second pad electrode PD1_2 may be the fourth conductive layer CL4 provided and/or formed on the first insulating layer INS1. The first-second pad electrode PD1_2 may be connected to the first-first pad electrode PD1_1 through a contact hole CH sequentially passing through the first insulating layer INS1, the protective layer PSV, and the second interlayer insulating layer ILD2. The first-second pad electrode PD1_2 may be a component in direct contact with a terminal of the driver implemented as a chip-on film or an integrated circuit. To this end, the first-second pad electrode PD1_2 may be in direct contact with the driver through a contact hole CH sequentially passing through the second and third insulating layers INS2 and INS3 positioned on the first-second pad electrode PD1_2.

The fourth conductive layer CL4 may be made of various transparent conductive materials (or substances). As an example, the fourth conductive layer CL4 may include at least one selected from among various transparent conductive materials such as ITO, IZO, ZnO, IGZO, and ITZO and may be formed to be substantially transparent or translucent to satisfy certain light transmittance (or transmittance). However, a material of the fourth conductive layer CL4 is not limited to an above-described embodiment. According to an embodiment, the fourth conductive layer CL4 may be made of various opaque conductive materials. The opaque conductive materials may include, for example, titanium (Ti), aluminum (Al), silver (Ag), and/or the like, but the disclosure is not limited thereto. The fourth conductive layer CL4 may be formed as a single film or a multi-film.

The second-second pad electrode PD2_2 may be the fourth conductive layer CL4 provided and/or formed on the first insulating layer INS1. The second-second pad electrode PD2_2 may be connected to the second-first pad electrode PD2_1 through a contact hole CH sequentially passing through the first insulating layer INS1, the protective layer PSV, and the second interlayer insulating layer ILD2. The second-second pad electrode PD2_2 may be a component in direct contact with a terminal of the driver. To this end, the second-second pad electrode PD2_2 may be in direct contact with the driver through a contact hole CH sequentially passing through the second and third insulating layers INS2 and INS3 positioned on the second-second pad electrode PD2_2.

The third-second pad electrode PD3_2 may be the fourth conductive layer CL4 provided and/or formed on the first insulating layer INS1. The third-second pad electrode PD3_2 may be connected to the third-first pad electrode PD3_1 through a contact hole CH sequentially passing through the first insulating layer INS1, the protective layer PSV, and the second interlayer insulating layer ILD2. The third-second pad electrode PD3_2 may be a component in direct contact with one terminal of the driver. To this end, the third-second pad electrode PD3_2 may be in direct contact with the driver through a contact hole CH sequentially passing through the second and third insulating layers INS2 and INS3 positioned on the third-second pad electrode PD3_2.

The fourth-second pad electrode PD4_2 may be the fourth conductive layer CL4 provided and/or formed on the first insulating layer INS1. The fourth-second pad electrode PD4_2 may be connected to the fourth-first pad electrode PD4_1 through a contact hole CH sequentially passing through the first insulating layer INS1, the protective layer PSV, and the second interlayer insulating layer ILD2. The fourth-second pad electrode PD4_2 may be a component in direct contact with a terminal of the driver. To this end, the fourth-second pad electrode PD4_2 may be in direct contact with the driver through a contact hole CH sequentially passing through the second and third insulating layers INS2 and INS3 positioned on the fourth-second pad electrode PD4_2.

The above-described first-second to fourth-second pad electrodes PD1_2 to PD4_2 may be provided on the same layer, may include the same material, and may be formed through the same process.

A fourth insulating layer INS4 may be provided and/or formed on the third insulating layer INS3.

The fourth insulating layer INS4 may be a planarization layer which relieves a step difference generated by components disposed thereunder. Also, the fourth insulating layer INS4 may be a protective layer for protecting all components disposed in the pixel area PXA. The fourth insulating layer INS4 may not be provided in the non-display area NDA to connect each of the first-second to fourth-second pad electrodes PD1_2 to PD4_2 and the driver.

Next, the display element part DPL of the pixel PXL will be described.

The display element part DPL may include the conductive pattern CP, first and second electrodes EL1 and EL2, a sixth connection line CNL6, the light-emitting elements LD, first and second contact electrodes CNE1 and CNE2 which are positioned in the second area A2 of the pixel area PXA.

The conductive pattern CP, the first and second electrodes EL1 and EL2, and the sixth connection line CNL6 may be provided on the substrate SUB. The conductive pattern CP, the first and second electrodes EL1 and EL2, and the sixth connection line CNL6 may be the first conductive layer CL1 provided and/or formed on the substrate SUB. The conductive pattern CP, the first and second electrodes EL1 and EL2, and the sixth connection line CNL6 may be provided on the same layer as the bottom metal layer BML provided in the first area A1 of the pixel area PXA, may include the same material as the bottom metal layer BML, and may be formed through the same process as the bottom metal layer BML.

The conductive pattern CP, the first and second electrodes EL1 and EL2, and the sixth connection line CNL6 may be made of a material having certain reflectance to allow light emitted from each of the light-emitting elements LD to travel in an image display direction of the display device. Each of the conductive pattern CP, the first and second electrodes EL1 and EL2, and the sixth connection line CNL6 may include a conductive material (or substance) having certain reflectance. The conductive material (or substance) may include an opaque metal that is advantageous for reflecting light emitted from the light-emitting elements LD in the image display direction of the display device. The opaque metal may include a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof. According to an embodiment, each of the conductive pattern CP, the first and second electrodes EL1 and EL2, and the sixth connection line CNL6 may include a transparent conductive material (or substance). The transparent conductive material may include transparent oxide such as ITO, IZO, ZnO, IGZO, and/or ITZO and a conductive polymer such as poly(3,4-ethylenedioxythiophene) (PEDOT). In case that each of the conductive pattern CP, the first and second electrodes EL1 and EL2, and the sixth connection line CNL6 includes a conductive material, a separate conductive layer made of an opaque metal may be provided to reflect light emitted from the light-emitting elements LD in the image display direction of the display device. However, a material of each of the conductive pattern CP, the first and second electrodes EL1 and EL2, and the sixth connection line CNL6 are not limited to the above-described materials.

Each of the conductive pattern CP, the first and second electrodes EL1 and EL2, and the sixth connection line CNL6 may be provided and/or formed as a single layer, but the disclosure is not limited thereto. According to an embodiment, each of the conductive pattern CP, the first and second electrodes EL1 and EL2, and the sixth connection line CNL6 may be formed as a multi-film in which two or more materials selected from among metals, alloys, conductive oxides, and conductive polymers are stacked on each other. According to an embodiment, each of the conductive pattern CP, the first and second electrodes EL1 and EL2, and the sixth connection line CNL6 may be formed as a multi-film including at least two films to minimize distortion due to a signal delay in case that a signal (or a voltage) is transmitted to both end portions of each of the light-emitting elements LD. In an embodiment, the conductive pattern CP, the first and second electrodes EL1 and EL2, and the sixth connection line CNL6 may be formed as a single film including aluminum neodymium (AlNd).

The conductive pattern CP may be connected to the bridge line BRL through a corresponding contact hole CH. In a plan view, the conductive pattern CP may be spaced apart from the first electrode EL1. Before the light-emitting elements LD are aligned in the pixel area PXA, the conductive pattern CP may be provided in a form connected to the first electrode EL1. For example, before the light-emitting elements LD are aligned, the conductive pattern CP and the first electrode EL1 may be connected to each other. After the light-emitting elements LD are aligned, the conductive pattern CP and the first electrode EL1 may be spaced apart from each other to be electrically and/or physically separated from each other.

The sixth connection line CNL6 may be connected to the second power line PL2 through a contact hole CH sequentially passing through the first interlayer insulating layer ILD1, the gate insulating layer GI, and the buffer layer BFL. In case that the light-emitting elements LD are aligned in the pixel area PXA, the sixth connection line CNL6 may receive an alignment signal (or an alignment voltage) from the second power line PL2 to apply the alignment signal to the second electrode EL2. Accordingly, the second electrode EL2 may be used as a second alignment electrode (or a second alignment line) before the light-emitting elements LD are aligned. After the light-emitting elements LD are aligned in the pixel area PXA, a voltage of the second driving power source VSS may be transmitted from the second power line PL2 to the second electrode EL2 through the sixth connection line CNL6. Accordingly, the second electrode EL2 may serve as a driving electrode for driving the light-emitting elements LD.

The sixth connection line CNL6 may extend in the first direction DR1. The sixth connection line CNL6 may be provided in common to the pixel PXL and pixels PXL adjacent thereto. Accordingly, multiple pixels PXL disposed in the same pixel row, for example, a first pixel row, in the first direction DR1 may be commonly connected to the sixth connection line CNL6.

The first electrode EL1 may extend in the second direction DR2. Before the light-emitting elements LD are aligned in the pixel area PXA, the first electrode EL1 may receive an alignment signal (or an alignment voltage) from the bridge line BRL and the conductive pattern CP to serve as the first alignment electrode (or the first alignment line). After the light-emitting elements LD are aligned in the pixel area PXA, the first electrode EL1 may be electrically separated from the conductive pattern CP and may be connected to the upper electrode UE through a contact hole CH to serve as a driving electrode for driving the light-emitting elements LD.

The second electrode EL2 may branch off from the sixth connection line CNL6 in the second direction DR2. The second electrode EL2 may be provided integrally with the sixth connection line CNL6. Accordingly, the second electrode EL2 and the sixth connection line CNL6 may be electrically and/or physically connected to each other. The sixth connection line CNL6 may be a region of the second electrode EL2, or the second electrode EL2 may be a region of the sixth connection line CNL6. However, the disclosure is not limited thereto, and according to an embodiment, the second electrode EL2 and the sixth connection line CNL6 may be formed separately from each other and may be electrically connected to each other through a separate connection or the like.

An alignment signal (or an alignment voltage) applied to the first electrode EL1 and an alignment signal (or an alignment voltage) applied to the second electrode EL2 may be signals having a voltage difference and/or a phase difference sufficient to align the light-emitting elements LD between the first electrode EL1 and the second electrode EL2. At least one alignment signal (or an alignment voltage) of the alignment signal (or the alignment voltage) applied to the first electrode EL1 and the alignment signal (or the alignment voltage) applied to the second electrode EL2 may be an alternating current signal, but the disclosure is not limited thereto.

In an embodiment, the first electrode EL1 may be an anode, and the second electrode EL2 may be a cathode.

The first electrode EL1 and the second electrode EL2 may be positioned in the emission area EMA of the second area A2 of the pixel area PXA. The emission area EMA may be an area in which light is finally emitted in the pixel area PXA.

The second interlayer insulating layer ILD2 may be provided and/or formed on the first electrode EL1 and the second electrode EL2. The second interlayer insulating layer ILD2 may be the same component as the second interlayer insulating layer ILD2 positioned in the first area A1 of the pixel area PXA. The second interlayer insulating layer ILD2 may expose a portion of the first electrode EL1 and a portion of the second electrode EL2 to the outside.

The light-emitting elements LD may be disposed on the second interlayer insulating layer ILD2.

Each of the light-emitting elements LD may be an ultra-small sized light-emitting diode made of a material having an inorganic crystal structure, for example, a light-emitting diode having a small size ranging from nanoscale to microscale. For example, each of the light-emitting elements LD may be an ultra-small sized light-emitting diode manufactured through an etching method or an ultra-small sized light-emitting diode manufactured through a growth method.

At least two to tens of light-emitting elements LD may be arranged and/or provided in the pixel area PXA, but the number of light-emitting elements LD is not limited thereto. According to an embodiment, the number of light-emitting elements LD arranged and/or provided in the pixel area PXA may be variously changed. The light-emitting element LD may be positioned in the emission area EMA of the pixel area PXA.

Each of the light-emitting elements LD may emit color light and/or white light. Each of the light-emitting elements may be aligned on the second interlayer insulating layer ILD2 between the first electrode EL1 and the second electrode EL2 such that an extending direction (or a direction of a length L) thereof is parallel to the first direction DR1. The light-emitting elements LD may be provided in a form sprayed in a solution and injected into the pixel area PXA.

The light-emitting elements LD may be injected into the pixel area PXA of each pixel PXL through an inkjet printing method, a slit coating method, or other various methods. As an example, the light-emitting elements LD may be mixed in a volatile solvent and supplied to the pixel area PXA through an inkjet printing method or a slit coating method. In case that an alignment signal corresponding to each of the first and second electrodes EL1 and EL2 provided in the pixel area PXA is applied, an electric field may be formed between the first electrode EL1 and the second electrode EL2. Accordingly, the light-emitting elements LD may be aligned between the first electrode EL1 and the second electrode EL2.

After the light-emitting elements LD are aligned, the solvent may be evaporated or removed through other methods to finally align and/or provide the light-emitting elements LD in the pixel area PXA of each pixel PXL.

The protective layer PSV may be provided and/or formed on the second interlayer insulating layer ILD2. The protective layer PSV may have the same component as the protective layer PSV positioned in the first area A1 of the pixel area PXA.

The protective layer PSV in the second area A2 of the pixel area PXA may be a bank for guiding alignment positions of the light-emitting elements LD in case that the light-emitting elements LD are aligned in the pixel area PXA. In case that the protective layer PSV is the bank, the protective layer PSV may be an inorganic insulating film including an inorganic material or an organic insulating film including an organic material. According to an embodiment, the protective layer PSV may include a single-layered organic insulating film and/or a single-layered inorganic insulating film, but the disclosure is not limited thereto. According to an embodiment, the protective layer PSV may be provided in the form of a multi-film in which at least one organic insulating film and at least one inorganic insulating film are stacked on each other. However, a material of the protective layer PSV is not limited to the above-described embodiments.

The above-described protective layer PSV may be provided in an area of the pixel area PXA except for the emission area EMA.

The first insulating layer INS1 may be provided on each of the light-emitting elements LD. The first insulating layer INS1 may be the same component as the first insulating layer INS1 positioned in the first area A1 of the pixel area PXA.

In the emission area EMA, the first insulating layer INS1 may be provided and/or formed on the light-emitting elements LD to partially cover an outer circumferential surface (or surface) of each of the light-emitting elements LD and also expose both end portion of the light-emitting elements LD to the outside. The first insulating layer INS1 may be formed as a single film or a multi-film and may include an inorganic insulating film including at least one inorganic material or an organic insulating film including at least one organic material. The first insulating layer INS1 may further fix each of the light-emitting elements LD. The first insulating layer INS1 may include an inorganic insulating film that is advantageous for protecting an active layer 12 of each of the light-emitting elements LD from external oxygen and moisture. However, the disclosure is not limited thereto. The first insulating layer INS1 may be formed as an organic insulating film including an organic material according to design conditions of the display device to which the light-emitting elements LD are applied.

After the alignment of the light-emitting elements LD in the pixel area PXA is completed, the first insulating layer INS1 may be formed on the light-emitting elements LD, thereby preventing the light-emitting elements LD from deviating from positions at which the light-emitting elements LD are disposed. In case that a gap (or a space) is present between the second interlayer insulating layer ILD2 and the light-emitting elements LD before the formation of the first insulating layer INS1, the gap may be filled with the first insulating layer INS1 in a process of forming the first insulating layer INS1. Accordingly, the first insulating layer INS1 may be formed as an organic insulating film that is advantageous for filling the gap between the second interlayer insulating layer ILD2 and the light-emitting elements LD.

Also, the first insulating layer INS1 may be provided in a peripheral area surrounding the emission area EMA. The first insulating layer INS1 may be provided and/or formed on the protective layer PSV. Specifically, the first insulating layer INS1 may be provided and/or formed on each protective layer PSV positioned in the second area A2 of the pixel area PXA.

The first and second contact electrodes CNE1 and CNE2 may be components which electrically more stably connect the first and second electrodes EL1 and EL2 and the light-emitting elements LD, respectively. The first and second contact electrodes CNE1 and CNE2 may be the fourth conductive layer CL4 provided and/or formed on the first insulating layer INS1. The first and second contact electrodes CNE1 and CNE2 may be disposed on the same layer as the first-second to fourth-second pad electrodes PD1_2 to PD4_2 provided in the non-display area NDA, may include the same material as the first-second to fourth-second pad electrodes PD1_2 to PD4_2, and may be formed through the same process as the first-second to fourth-second pad electrodes PD1_2 to PD4_2.

The first contact electrode CNE1 may be provided on the first insulating layer INS1 and may be connected to the first electrode EL1 exposed to the outside. The first contact electrode CNE1 may be provided and/or formed on an end portion of each of the light-emitting elements LD to be connected to one end portion of each of the light-emitting elements LD. A certain signal applied to the first electrode EL1 may be transmitted to one end portion of each of the light-emitting elements LD through the first contact electrode CNE1.

The second contact electrode CNE2 may be provided on the first insulating layer INS1 and may be connected to the second electrode EL2 exposed to the outside. T the second contact electrode CNE2 may be provided and/or formed on another end portion of each of the light-emitting elements LD to be connected to another end portion of each of the light-emitting elements LD. A certain signal applied to the second electrode EL2 may be transmitted to another end portion of each of the light-emitting elements LD through the second contact electrode CNE2.

In a plan view, each of the first and second contact electrodes CNE1 and CNE2 may have a bar shape extending in the second direction DR2, but the disclosure is not limited thereto. According to an embodiment, a shape of each of the first and second contact electrodes CNE1 and CNE2 may be variously changed within a range in which the first and second contact electrodes CNE1 and CNE2 are electrically and stably connected to each of the light-emitting elements LD. Also, the shape of each of the first and second contact electrodes CNE1 and CNE2 may be variously changed in consideration of a connection relationship with the electrodes disposed thereunder.

The first and second contact electrodes CNE1 and CNE2 may be positioned in the emission area EMA of the pixel area PXA.

The second insulating layer INS2 may be provided and/or formed on the first and second contact electrodes CNE1 and CNE2. The second insulating layer INS2 may be the same component as the second insulating layer INS2 positioned in the first area A1 of the pixel area PXA. The second insulating layer INS2 may be an inorganic insulating film including an inorganic material or an organic insulating film including an organic material. As an example, the second insulating layer INS2 may have a structure in which at least one inorganic insulating film or at least one organic insulating film are alternately stacked on each other. The second insulating layer INS2 may be an encapsulation layer which covers the entirety of the display element part DPL and blocks external moisture or moisture from being introduced into the display element part DPL including the light-emitting elements LD.

A light conversion pattern layer LCP may be provided and/or formed on the second insulating layer INS2. The light conversion pattern layer LCP may be positioned in the emission area EMA of the pixel area PXA. The light conversion pattern layer LCP may include a color conversion layer CCL and a color filter CF.

The color conversion layer CCL may include color conversion particles QD corresponding to a specific color. The color filter CF may selectively transmit light having the specific color.

The color conversion layer CCL may include color conversion particles QD that convert light emitted from the light-emitting elements LD disposed in the pixel PXL into the light having the specific color. As an example, in case that the pixel PXL is a red pixel, the color conversion layer CCL may include color conversion particles QD of red quantum dots that convert light emitted from the light-emitting elements LD into red light. As another example, in case that the pixel PXL is a green pixel, the color conversion layer CCL may include color conversion particles QD of green quantum dots that convert light emitted from the light-emitting elements LD into green light. As still another example, in case that the pixel PXL is a blue pixel, the color conversion layer CCL may include color conversion particles QD of blue quantum dots that convert light emitted from the light-emitting elements LD into blue light.

The third insulating layer INS3 may be provided and/or formed on the color conversion layer CCL. The third insulating layer INS3 may be the same component as the third insulating layer INS3 positioned in the first area A1 of the pixel area PXA. The third insulating layer INS3 may include the same material as the second insulating layer INS2 or may include at least one material selected from among materials disclosed as structural material of the second insulating layer INS2. As an example, the third insulating layer INS3 may be an inorganic insulating film including an inorganic material or an organic insulating film including an organic material.

The color filter CF may be provided and/or formed on the third insulating layer INS3. The color filter CF may constitute the light conversion pattern layer LCP together with the color conversion layer CCL and may include a color filter material that selectively transmits light having a specific color converted by the color conversion layer CCL. The color filter CF may include a red color filter, a green color filter, and a blue color filter. The above-described color filter CF may be provided in the emission area EMA of the pixel area PXA to correspond to the color conversion layer CCL.

The fourth insulating layer INS4 may be provided on the color filter CF. The fourth insulating layer INS4 may be the same component as the fourth insulating layer INS4 positioned in the first area A1 of the pixel area PXA. The fourth insulating layer INS4 may be a planarization layer which relieves a step difference generated by components disposed thereunder in the second area A2 of the pixel area PXA.

In case that a driving current flows from the first power line PL1 to the second power line PL2 through the pixel circuit PXC by the first transistor T1 included in the pixel circuit PXC of the pixel PXL, the driving current may flow into an emission unit (see "EMU" in FIGS. 6A to 6C) of the pixel PXL through a sixth transistor T6 and the upper electrode UE. As an example, a driving current is supplied to the first electrode EL1 through the upper electrode UE and a corresponding contact hole CH, and the driving current flows to the second electrode EL2 through the light-emitting elements LD. Accordingly, each of the light-emitting elements LD may emit light with luminance corresponding to a distributed current.

As described above, each of the pixel circuit part PCL and the display element part DPL of the pixel PX may be provided as a multi-layer including at least one conductive layer and at least one insulating layer provided and/or formed on one surface of the substrate SUB. At least one layer of the pixel circuit part PCL and at least one layer of the display element part DPL may be provided on the same layer, may include the same material, and may be formed through the same process.

According to an above-described embodiment, the components included in the pixel circuit part PCL and the components included in the display element part DPL may be formed through the same process, thereby providing a display device in which the number of masks is reduced to simplify a manufacturing process compared to an existing display device in which the pixel circuit part PCL and the display element part DPL are formed through separate processes. In case that a manufacturing process of a display device is simplified, manufacturing costs of the display device can be reduced.

According to an above-described embodiment, the light-emitting elements LD may be intensively aligned in a desired area (or a target area), for example, in the second area A2 in which the display element part DPL is positioned in the pixel area PXA of the pixel PXL so that an alignment distribution of the light-emitting elements LD in the pixel PXL and an alignment distribution of the light-emitting elements LD in the adjacent pixels PXL can be uniform. The display device may have a uniform light emission distribution in an entire area.

According to an above-described embodiment, in case that the light-emitting elements LD are intensively aligned in a target area, the number of unaligned light-emitting elements LD can be reduced. Accordingly, it may be possible to minimize a loss of the light-emitting elements LD, and it may be possible to prevent an abnormal misalignment in which the light-emitting elements LD are aligned in an undesired area.

FIGS. 10A to 10M are schematic cross-sectional views sequentially illustrating a method of manufacturing the display device shown in FIG. 8.

Hereinafter, the display device according to an embodiment shown in FIG. 8 will be described in order according to a manufacturing method with reference to FIGS. 10A to 10M.

Referring to FIGS. 1 to 5, 7, 8, and 10A, a substrate SUB is provided.

A first conductive layer CL1 made of a conductive material (or substance) having high reflectance may be formed in each of a first area A1 and a second area A2 on the substrate SUB.

The first conductive layer CL1 of the first area A1 may be a first conductive layer positioned on the substrate SUB among conductive layers included in a pixel circuit part PCL, and the first conductive layer CL1 of the second area A2 may be a first conductive layer positioned on the substrate SUB among conductive layers included in a display element part DPL.

The first conductive layer CL1 of the pixel circuit part PCL and the first conductive layer CL1 of the display element part DPL may be provided on the same layer, may include the same material, and may be formed through the same process.

The first conductive layer CL1 of the pixel circuit part PCL may include a bottom metal layer BML. The first conductive layer CL1 of the display element part DPL may include first and second electrodes EL1 and EL2, a conductive pattern CP, and a sixth connection line CNL6.

Referring to FIGS. 1 to 5, 7, 8, 10A, and 10B, a buffer layer BFL may be formed on the substrate SUB including the first conductive layer CL1. A semiconductor layer SCL may be formed on the buffer layer BFL.

The semiconductor layer SCL may be made of silicon (Si), For example, amorphous silicon or polysilicon. In case that the semiconductor layer SCL is made of amorphous silicon, a crystallization process may be further performed using a laser or the like.

According to an embodiment, the semiconductor layer SCL may be made of a semiconductor oxide that includes binary compound ($AB_x$), a ternary compound ($AB_xC_y$), a quaternary compound ($AB_xC_yD_z$), or the like including Indium (In), zinc (Zn), gallium (Ga), tin (Sn), titanium (Ti), aluminum (Al), hafnium (Hf), zirconium (Zr), and magnesium (Mg). The materials may be used alone or in combination.

The semiconductor layer SCL may be provided only in the first area A1 included in a pixel area PXA of the pixel PXL, but the disclosure is not limited thereto. According to an embodiment, the semiconductor layer SCL may also be provided in the second area A2 included in the pixel area PXA.

Referring to FIGS. 1 to 5, 7, 8, and 10A to 10C, a gate insulating layer GI may be formed on the buffer layer BFL including the semiconductor layer SCL.

A second conductive layer CL2 may be formed on the gate insulating layer GI.

The second conductive layer CL2 may include a lower electrode LE of a storage capacitor Cst positioned in the first area A1 of the pixel area PXA, first to third gate electrodes GE1 to GE3, an initialization power line IPL, a control line CLi, and a scan line Si.

A region of the semiconductor layer SCL overlapping the first gate electrode GE1 may be a first active pattern ACT1. Both side portions of the first active pattern ACT1 which do not overlap the first gate electrode GE1 may become a first source region SE1 and a first drain region DE1. The first active pattern ACT1, the first gate electrode GE1, the first source region SE1, and the first drain region DE1 may constitute a first transistor T1.

A region of the semiconductor layer SCL overlapping the second gate electrode GE2 may become a second active pattern ACT2. Both side portions of the second active pattern ACT2 which do not overlap the second gate electrode GE2 may become a second source region SE2 and a second drain region DE2. The second active pattern ACT2, the second gate electrode GE2, the second source region SE2, and the second drain region DE2 may constitute a second transistor T2.

A region of the semiconductor layer SCL overlapping the third gate electrode GE3 may become a third active pattern ACT3. Both side portions of the third active pattern ACT3 which do not overlap the third gate electrode GE3 may become a third source region SE3 and a third drain region DE3. The third active pattern ACT3, the third gate electrode GE3, the third source region SE3, and the third drain region DE3 may constitute a third transistor T3.

Referring to FIGS. 1 to 5, 7, 8, and 10A to 10D, after an insulating material layer is applied on the second conductive layer CL2, a process using a mask may be performed to form a first interlayer insulating layer ILD1 including multiple contact holes CH and an opening OPN exposing a portion of the second area A2 of the pixel area PXA. The opening OPN may be an emission area EMA in which, after light-emitting elements LD are aligned in the pixel area PXA, light may be emitted from the light-emitting elements LD.

Through such a process, contact holes CH sequentially passing through the first interlayer insulating layer ILD1, the gate insulating layer GI, and the buffer layer BFL to expose a portion of the bottom metal layer BML, a portion of the first electrode EL1, a portion of the conductive pattern CP and a portion of the sixth connection line CNL6, contact holes CH sequentially passing through the gate insulating layer GI and the first interlayer insulating layer ILD1 to expose portions of the first to third source regions SE1 to SE3, and contact holes CH exposing portions of the first to third drain regions DE1 to DE3 may be formed. Through the above-described process, contact holes CH passing through the first interlayer insulating layer ILD1 to expose a portion of the scan line Si, a portion of the control line Cli, and a portion of the initialization power line IPL may be formed. Through the above-described process, contact holes CH passing through the first interlayer insulating layer ILD1 to expose portions of the first to third gate electrodes GE1 to GE3 may be formed.

Referring to FIGS. 1 to 5, 7, 8, and 10A to 10E, a third conductive layer CL3 may be formed on the first interlayer insulating layer ILD1 including the contact holes CH.

The third conductive layer CL3 may include first to fifth connection lines CNL1 to CNL5 positioned in the first area A1 of the pixel area PXA and an upper electrode UE of the storage capacitor Cst. The third conductive layer CL3 may include a bridge line BRL, a data line Dj, and first and second power lines PL1 and PL2 positioned over the first and second areas A1 and A2 of the pixel area PXA. The third conductive layer CL3 may include first to fourth fan-out lines FOL1 to FOL4 and first-first to fourth-first pad electrodes PD1_1 to PD4_1 positioned in a non-display area NDA.

The bridge line BRL may be electrically connected to the conductive pattern CP through a contact hole CH sequentially passing through the first interlayer insulating layer ILD1, the gate insulating layer GI, and the buffer layer BFL. The bridge line BRL may be provided integrally with the first fan-out line FOL1 and the first-first pad electrode PD1_1 of the non-display area NDA.

The data line Dj may be electrically connected to the second drain region DE2 through a contact hole CH sequentially passing through the first interlayer insulating layer ILD1 and the gate insulating layer GI. The data line Dj may be provided integrally with the second fan-out line FOL2 and the second-first pad electrode PD2_1 of the non-display area NDA.

The first power line PL1 may be electrically connected to the first drain region DE1 through a contact hole CH sequentially passing through the first interlayer insulating layer ILD1 and the gate insulating layer GI. The first power line PL1 may be provided integrally with the third fan-out line FOL3 and the third-first pad electrode PD3_1 of the non-display area NDA.

The second power line PL2 may be electrically connected to the sixth connection line CNL6 through a contact hole CH sequentially passing through the first interlayer insulating layer ILD1, the gate insulating layer GI, and the buffer layer BFL. The second power line PL2 may be provided integrally with the fourth fan-out line FOL4 and the fourth-first pad electrode PD4_1 of the non-display area NDA.

The upper electrode UE may be electrically connected to the bottom metal layer BML through a contact hole CH sequentially passing through the first interlayer insulating layer ILD1, the gate insulating layer GI, and the buffer layer BFL. The upper electrode UE may be electrically connected the first source region SE1 and the third source region SE3 through contact holes CH sequentially passing through the first interlayer insulating layer ILD1 and the gate insulating layer GI, respectively. The upper electrode UE may be electrically connected to the first electrode EL1 through a contact hole CH sequentially passing through the first interlayer insulating layer ILD1, the gate insulating layer GI, and the buffer layer BFL.

The first connection line CNL1 may be electrically connected to the scan line Si and the second gate electrode GE2 through contact holes CH passing through the first interlayer insulating layer ILD1, respectively.

The second connection line CNL2 may be electrically connected to the second source region SE2 through a contact hole CH sequentially passing through the first interlayer insulating layer ILD1 and the gate insulating layer GI and may be electrically connected to the first gate electrode GE1 through a contact hole CH passing through the first interlayer insulating layer ILD1.

The third connection line CNL3 may be electrically connected to the third gate electrode GE3 through a contact hole CH passing through the first interlayer insulating layer ILD1 and may be electrically connected to the control line Cli through a contact hole CH passing through the first interlayer insulating layer ILD1.

The fourth connection line CNL4 may be electrically connected to the third drain region DE3 through a contact hole CH sequentially passing through the first interlayer insulating layer ILD1 and the gate insulating layer GI and may be electrically connected to the initialization power line IPL through a contact hole CH passing through the first interlayer insulating layer ILD1.

The fifth connection line CNL5 may be electrically connected to the bottom metal layer BML through a contact hole CH sequentially passing through the first interlayer insulating layer ILD1, the gate insulating layer GI, and the buffer layer BFL and may be electrically connected to the first source region SE1 through a contact hole CH sequentially passing through the first interlayer insulating layer ILD1 and the gate insulating layer GI.

In case that the third conductive layer CL3 formed through the above-described process is formed as a double layer stacked in the order of titanium (Ti)/copper (Cu), the first and second electrodes EL1 and EL2 exposed to the outside in the second area A2 may be affected by an etchant used in an etching process of forming the third conductive layer CL3. Accordingly, the first and second electrodes EL1 and EL2 may be formed by selecting a conductive material (or substance) that is not affected by the etchant.

Referring to FIGS. 1 to 5, 7, 8, and 10A to 10F, a second interlayer insulating layer ILD2 and a protective layer PSV may be sequentially formed on the third conductive layer CL3.

In the second area A2 of the pixel area PXA, the second interlayer insulating layer ILD2 may be positioned on the first and second electrodes EL1 and EL2 exposed to the outside by the opening OPN to cover the first and second electrodes EL1 and EL2.

The protective layer PSV may be provided on the second interlayer insulating layer ILD2.

The protective layer PSV may expose a portion of the second interlayer insulating layer ILD2 of the non-display area NDA and may not be provided on the second interlayer insulating layer ILD2 on the first and second electrodes EL1 and EL2. A portion of the second interlayer insulating layer ILD2 partially exposed in the non-display area NDA may correspond to a position of each of the first-first to fourth-first pad electrodes PD1_1 to PD4_1.

The protective layer PSV may not be disposed on the second interlayer insulating layer ILD2 on the first and second electrodes EL1 and EL2. The protective layer PSV may not overlap the first and second electrodes EL1 and EL2 and surrounds the first and second electrodes EL1 and EL2, thereby serving as a bank for guiding alignment positions of the light-emitting elements LD in the second area A2 of the pixel area PXA.

Referring to FIGS. 1 to 5, 7, 8, and 10A to 10G, alignment signals (or alignment voltages) corresponding to the first electrode EL1 and the second electrode EL2 may be applied through the first-first and fourth-first pad electrodes PD1_1 and PD4_1 and the first and fourth fan-out lines FOL1 and FOL4, thereby forming an electric field between the first electrode EL1 and the second electrode EL2. The alignment signal of the first-first pad electrode PD1_1 and the first fan-out line FOL1 may be transmitted to the first electrode EL1 through the bridge line BRL and the conductive pattern CP, and the alignment signal of the fourth-first pad electrode PD4_1 and the fourth fan-out line FOL4 may be transmitted to the second electrode EL2 through the second power line PL2 and the sixth connection line CNL6.

Each of the first electrode EL1 and the second electrode EL2 may be an alignment electrode (or an alignment line) for aligning the light-emitting elements LD in the second area A2 of the pixel area PXA.

In case that an alignment signal (or an alignment voltage) of alternating current (AC) power or direct current (DC) power having a certain voltage and cycle is applied to each of the first electrode EL1 and the second electrode EL2, an electric field according to a potential difference between the first electrode EL1 and the second electrode EL2 may be formed between the first electrode EL1 and the second electrode EL2. In a state in which an electric field is formed between the first electrode EL1 and the second electrode EL2, a mixed solution including the light-emitting elements LD is injected into the pixel area PXA using an inkjet printing method or the like. As an example, an inkjet nozzle may be disposed above the second interlayer insulating layer ILD2 of the second area A2, a solvent mixed with the light-emitting elements LD may be injected into the pixel area PXA through the inkjet nozzle. Here, the solvent may be at least one selected from among acetone, water, alcohol, and toluene, but the disclosure is not limited thereto. For example, the solvent may be in the form of an ink or paste. A method of injecting the light-emitting elements LD into the pixel area PXA is not limited to an above-described embodiment, and the method of injecting the light-emitting elements LD may be variously changed.

After the light-emitting elements LD are injected, the solvent may be removed.

In case that the light-emitting elements LD are injected into the pixel area PXA, a self-alignment of the light-emitting elements LD may be induced due to an electric field formed between the first electrode EL1 and the second electrode EL2. Accordingly, the light-emitting elements LD may be aligned between the first electrode EL1 and the second electrode EL2. Specifically, each of the light-emitting elements LD may be aligned on the second interlayer insulating layer ILD2 positioned in the second area A2 of the pixel area PXA.

Referring to FIGS. 1 to 5, 7, 8, and 10A to 10H, after the light-emitting elements LD are aligned, an insulating material layer may be applied on the protective layer PSV and the light-emitting elements LD, and a process using a mask may be performed to form a first insulating layer INS1.

The first insulating layer INS1 may include contact holes CH exposing portions of the first-first to fourth-first pad electrodes PD1_1 to PD4_1 in the non-display area NDA and may cover at least a portion of an upper surface of each of the light-emitting elements LD to expose both end portions of each of the light-emitting elements LD to the outside.

Through the above-described process, a portion of the second interlayer insulating layer ILD2 positioned in the second area A2 of the pixel area PXA may be removed to expose a portion of each of the first and second electrodes EL1 and EL2.

A portion of the conductive pattern CP or a portion of the first electrode EL1 may be removed to electrically separate the conductive pattern CP from the first electrode EL1 through the above-described process such that the pixel PXL is driven independently (or separately) from the pixels PXL adjacent thereto.

Referring to FIGS. 1 to 5, 7, 8, and 10A to 10I, a fourth conductive layer CL4 may be formed on the first insulating layer INS1.

The fourth conductive layer CL4 may include first and second contact electrodes CNE1 and CNE2 positioned in the second area A2 of the pixel area PXA. The fourth conductive layer CL4 may include first-second to fourth-second pad electrodes PD1_2 to PD4_2 in the non-display area NDA.

The first-second pad electrode PD1_2 may be electrically connected to the first-first pad electrode PD1_1 exposed to the outside through a contact hole CH sequentially passing through the first insulating layer INS1, the protective layer PSV, and the second interlayer insulating layer ILD2.

The second-second pad electrode PD2_2 may be electrically connected to the second-first pad electrode PD2_1 exposed to the outside through a contact hole CH sequentially passing through the first insulating layer INS1, the protective layer PSV, and the second interlayer insulating layer ILD2.

The third-second pad electrode PD3_2 may be electrically connected to the third-first pad electrode PD3_1 exposed to the outside through a contact hole CH sequentially passing through the first insulating layer INS1, the protective layer PSV, and the second interlayer insulating layer ILD2.

The fourth-second pad electrode PD4_2 may be electrically connected to the fourth-first pad electrode PD4_1 exposed to the outside through a contact hole CH sequentially passing through the first insulating layer INS1, the protective layer PSV, and the second interlayer insulating layer ILD2.

The first contact electrode CNE1 may be provided on the first insulating layer INS1 and may overlap the first electrode EL1 and an end portion of both end portions of each of the light-emitting elements LD. The first contact electrode CNE1 may be connected to the first electrode EL1 exposed to the outside and may be connected to an end portion of both end portions of each of the light-emitting elements LD.

The second contact electrode CNE2 may be provided on the first insulating layer INS1 and may overlap the second electrode EL2 and another end portion of both end portions of each of the light-emitting elements LD. The second contact electrode CNE2 may be connected to the second electrode EL2 exposed to the outside and may be connected to another end portion of both end portions of each of the light-emitting elements LD.

Referring to FIGS. 1 to 5, 7, 8, and 10A to 10J, a light blocking layer LBL may be formed in the pixel area PXA.

The light blocking layer LBL may be provided on the first insulating layer INS1 of the first area A1 of the pixel area PXA. Also, the light blocking layer LBL may be provided on the first insulating layer INS1 of the remaining area except for the emission area EMA in which the light-emitting elements LD are aligned to emit light in the second area A2 of the pixel area PXA.

The light blocking layer LBL may include a light blocking material that prevents a light leakage defect in which light (or beam) leaks between the pixel PXL and the pixels PXL adjacent thereto. As an example, the light blocking layer LBL may include a black matrix.

Referring to FIGS. 1 to 5, 7, 8, and 10A to 10K, a second insulating layer INS2 may be formed on the light blocking layer LBL and the fourth conductive layer CL4, respectively.

A color conversion layer CCL including color conversion particles QD may be formed on the second insulating layer INS2 on the fourth conductive layer CL4. The color conversion layer CCL may be provided on the second insulating layer INS2 of the second area A2 to correspond to the emission area EMA of the pixel area PXA.

Subsequently, a third insulating layer INS3 may be formed on the second insulating layer INS2 including the color conversion layer CCL. The second and third insulating layers INS2 and INS3 may be an inorganic insulating film including an inorganic material or an organic insulating film including an organic material.

Referring to FIGS. 1 to 5, 7, 8, and 10A to 10L, a color filter CF may be formed on the third insulating layer INS3 on the color conversion layer CCL. The color filter CF may be provided on a region of the third insulating layer INS3 to correspond to the color conversion layer CCL. The color filter CF and the color conversion layer CCL may constitute a light conversion pattern layer LCP which converts light emitted from the light-emitting elements LD into light having a specific color and selectively transmits the light.

Referring to FIGS. 1 to 5, 7, 8, and 10A to 10M, a process using a mask may be performed to form contact holes CH sequentially passing through the second and third insulating layers INS2 and INS3, thereby exposing the first-second to fourth-second pad electrodes PD1_2 to PD4_2 to the outside.

Each of the first-second to fourth-second pad electrodes PD1_2 to PD4_2 exposed to the outside by the contact holes CH may be connected directly to a driver implemented as a chip-on-film or an integrated circuit.

A fourth insulating layer INS4 may be formed on the third insulating layer INS3. The fourth insulating layer INS4 may be provided only in the pixel area PXA.

In a display device manufactured through such a manufacturing process, the pixel circuit part PCL and the display element part DPL may be disposed on one surface of the same substrate SUB so that a thickness of the display device can be reduced compared to an existing display device in which the display element part DPL is disposed on the pixel circuit part PCL.

In the display device manufactured through the above-described manufacturing process, the components included in the pixel circuit part PCL and the components included in the display element part DPL may be formed through the same process, thereby reducing the number of masks to simplify a manufacturing process compared to an existing display device in which the pixel circuit part PCL and the display element part DPL are formed through separate processes.

While the disclosure has been described with reference to embodiments thereof, it will be understood by those of ordinary skill in the art that the disclosure may be variously modified and changed without departing from the spirit and scope of the disclosure as defined by the appended claims. Therefore, the technical scope of the disclosure should not be limited to the contents described in the detailed description of the specification but should be defined by the claims.

What is claimed is:

1. A display device comprising:

a substrate including pixel areas; and a pixel disposed in each pixel area of the pixel areas, wherein:

the pixel includes a pixel circuit part and a display element part, and the pixel circuit part is disposed in a first area and includes:

a bottom metal layer disposed on the substrate;

at least one transistor disposed above the bottom metal layer; and at least one insulating layer above the transistor; and the display element part is disposed in a second area and includes:

a first electrode and a second electrode spaced apart from each other;

light-emitting elements disposed between the first electrode and the second electrode to emit light;

a first contact electrode above the light-emitting elements to electrically connect the first electrode to a first end of the light-emitting elements and a second contact electrode above the light-emitting elements to electrically connect the second electrode to a second end of the light-emitting elements; and the at least one insulating layer vertically between the first electrode and the first contact electrode and vertically between the second electrode and the second contact electrode, and wherein the first electrode, the second electrode, and the bottom metal layer are formed of a same layer.

2. The display device of claim 1, wherein:

each of the pixel circuit part and the display element part include a first insulating layer, a second insulating layer, a third insulating layer, and a fourth insulating layer that are sequentially disposed on the substrate;

the pixel circuit part includes a first conductive layer disposed between the substrate and the first insulating layer, a second conductive layer disposed on the first insulating layer, a third conductive layer disposed on the second insulating layer, and a fourth conductive layer disposed on the fourth insulating layer;

the display element part includes the first conductive layer disposed between the substrate and the first insulating layer and the fourth conductive layer disposed on the fourth insulating layer;

the at least one insulating layer includes the fourth insulating layer; and the first conductive layer includes the bottom metal layer, the first electrode, and the second electrode.

3. The display device of claim 2, wherein:

the second area includes an emission area from which the light is emitted;

the third insulating layer is disposed on the first and second electrodes in the emission area to expose a portion of each of the first and second electrodes; and the fourth insulating layer is disposed on one surface of each of the light-emitting elements in the emission area to expose the first end of the light-emitting elements and the second end of the light-emitting elements.

4. The display device of claim 3, wherein the fourth insulating layer exposes the first end of the light-emitting elements and the second end of the light-emitting elements.

5. The display device of claim 3, wherein:

the fourth conductive layer includes the first contact electrode and the second contact electrode.

6. The display device of claim 5, wherein:

the substrate includes a display area in which the pixel areas are disposed and a non-display area that surrounds at least one side of the display area;

a line part electrically connected to the pixel circuit part and a pad part electrically connected to the line part are disposed in the non-display area; and the pad part includes:

a first pad electrode disposed on the second insulating layer; and a second pad electrode disposed on the first pad electrode and in electrical contact with the first pad electrode.

7. The display device of claim 6, wherein:

the second pad electrode is disposed on the fourth insulating layer; and the fourth conductive layer includes the second pad electrode.

8. The display device of claim 7, wherein the first contact electrode, the second contact electrode, and the second pad electrode are disposed on a same layer.

9. The display device of claim 7, further comprising a protective layer disposed between the third insulating layer and the fourth insulating layer, wherein the protective layer is disposed in each of the non-display area, the first area, and a portion of the second area except for the emission area.

10. The display device of claim 9, further comprising a light blocking layer disposed on the protective layer.

11. The display device of claim 10, wherein the light blocking layer includes a black matrix.

12. The display device of claim 10, further comprising a light conversion pattern layer disposed in the emission area of the second area and disposed on the first contact electrode and the second contact electrode.

13. The display device of claim 12, further comprising a fifth insulating layer disposed on the light conversion pattern layer.

14. The display device of claim 2, wherein:

the transistor includes:

an active pattern disposed on the first insulating layer;

a gate electrode disposed on the second insulating layer and overlapping the active pattern; and a first terminal and a second terminal that are in electrical contact with both ends of the active pattern; and the second conductive layer includes the gate electrode.

15. A method of manufacturing a display device, the method comprising:

providing a substrate including pixel areas; and providing a pixel in each pixel area of the pixel areas, wherein the providing of the pixel includes:

forming a first conductive layer on the substrate;

wherein:

the pixel includes a pixel circuit part and a display element part, and the pixel circuit part is disposed in a first area and includes:

a bottom metal layer disposed on the substrate;

at least one transistor disposed above the bottom metal layer; and at least one insulating layer above the transistor; and the display element part is disposed in a second area and includes:

a first electrode and a second electrode spaced apart from each other;

light-emitting elements disposed between the first electrode and the second electrode to emit light;

a first contact electrode above the light emitting elements to electrically connect the first electrode to a first end of the light emitting elements and a second contact electrode above the light emitting elements to electrically connect the second electrode to a second end of the light emitting elements; and the at least one insulating layer vertically between the first electrode and the first contact electrode and vertically between the second electrode and the second contact electrode; and wherein the first electrode, the second electrode, and the bottom metal layer are formed of the first conductive layer.

16. The method of claim 15, wherein:

the substrate includes:

a display area in which the pixel area is disposed; and a non-display area which surrounds at least one side of the display area; and the non-display area includes:

a first pad electrode; and a second pad electrode in electrical contact with the first pad electrode.

17. The method of claim 16, wherein:

the second pad electrode, the first contact electrode, and the second contact electrode are formed through a same process.

18. The method of claim 17, further comprising:

forming a light blocking layer, forming a light conversion pattern layer on the light blocking layer; and forming an additional insulating layer on the light conversion pattern layer.

* * * * *